(12) United States Patent
Koyama

(10) Patent No.: US 8,593,066 B2
(45) Date of Patent: *Nov. 26, 2013

(54) LIGHT EMITTING DEVICE, DRIVING METHOD FOR SAME AND ELECTRONIC APPARATUS

(75) Inventor: Jun Koyama, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 204 days.

This patent is subject to a terminal disclaimer.

(21) Appl. No.: 13/186,536

(22) Filed: Jul. 20, 2011

(65) Prior Publication Data

US 2011/0273432 A1  Nov. 10, 2011

Related U.S. Application Data

(60) Continuation of application No. 12/434,028, filed on May 1, 2009, now Pat. No. 7,990,350, which is a continuation of application No. 11/530,204, filed on Sep. 8, 2006, now Pat. No. 7,545,353, which is a continuation of application No. 11/139,441, filed on May 31, 2005, now Pat. No. 7,106,006, which is a continuation of application No. 10/715,472, filed on Nov. 19, 2003, now Pat. No. 6,914,390, which is a division of application No. 10/101,628, filed on Mar. 21, 2002, now Pat. No. 6,661,180.

(30) Foreign Application Priority Data

Mar. 22, 2001 (JP) ................................ 2001-081779

(51) Int. Cl.
*G09G 3/10* (2006.01)

(52) U.S. Cl.
USPC ........................... 315/169.3; 345/77; 345/204

(58) Field of Classification Search
USPC .......... 315/169.1, 169.3; 345/204, 76, 77, 82, 345/83
See application file for complete search history.

(56) References Cited

U.S. PATENT DOCUMENTS 4,935,671 A * 6/1990 Harada et al. .............. 315/169.3
5,095,248 A   3/1992 Sato
(Continued)

FOREIGN PATENT DOCUMENTS

EP    1020920 A2    7/2000
EP    1063630 A2    12/2000
(Continued)

OTHER PUBLICATIONS

Baldo, M.A. et al.; "Highly efficient phosphorescent emission from organic electroluminescent devices", Letters to Nature vol. 395, (1998), pp. 151-154.

(Continued)

*Primary Examiner* — Thuy Vinh Tran
(74) *Attorney, Agent, or Firm* — Fish & Richardson P.C.

(57) ABSTRACT

It is a problem to provide a light-emitting device capable of obtaining a constant brightness without being affected by deterioration in an organic light-emitting layer or temperature change, and of making desired color display. The lowering in OLED brightness due to deterioration is reduced by causing the OLED to emit light while keeping constant the current flowing through the OLED instead of causing the OLED to emit light while keeping constant the OLED drive voltage. Namely, OLED brightness is controlled not by voltage but by current thereby preventing against the change in OLED brightness due to deterioration of OLED. Specifically, the drain current Id of a transistor for supplying a current to the OLED is controlled in a signal line drive circuit thereby keeping constant the drain current Id without relying upon the value of a load resistance.

23 Claims, 27 Drawing Sheets

(56) References Cited

U.S. PATENT DOCUMENTS

| | | | |
|---|---|---|---|
| 5,247,190 A | 9/1993 | Friend et al. | |
| 5,359,341 A | 10/1994 | Hutchings | |
| 5,399,502 A | 3/1995 | Friend et al. | |
| 5,581,160 A | 12/1996 | Fujita | |
| 5,608,245 A * | 3/1997 | Martin | 257/291 |
| 5,673,058 A | 9/1997 | Uragami et al. | |
| 5,990,629 A | 11/1999 | Yamada et al. | |
| 6,023,259 A | 2/2000 | Howard et al. | |
| 6,037,719 A | 3/2000 | Yap et al. | |
| 6,091,203 A | 7/2000 | Kawashima et al. | |
| 6,121,943 A | 9/2000 | Nishioka et al. | |
| 6,169,528 B1 | 1/2001 | Oguchi et al. | |
| 6,229,505 B1 | 5/2001 | Fujii | |
| 6,229,506 B1 | 5/2001 | Dawson et al. | |
| 6,229,508 B1 | 5/2001 | Kane | |
| 6,246,180 B1 | 6/2001 | Nishigaki | |
| 6,246,384 B1 | 6/2001 | Sano | |
| 6,246,387 B1 | 6/2001 | Yamazaki | |
| 6,274,887 B1 | 8/2001 | Yamazaki et al. | |
| 6,278,131 B1 | 8/2001 | Yamazaki et al. | |
| 6,310,589 B1 | 10/2001 | Nishigaki et al. | |
| 6,326,935 B1 | 12/2001 | Boger | |
| 6,348,906 B1 | 2/2002 | Dawson et al. | |
| 6,373,454 B1 | 4/2002 | Knapp et al. | |
| 6,380,687 B1 | 4/2002 | Yamazaki | |
| 6,429,601 B1 | 8/2002 | Friend et al. | |
| 6,469,317 B1 | 10/2002 | Yamazaki et al. | |
| 6,501,466 B1 | 12/2002 | Yamagishi et al. | |
| 6,528,950 B2 | 3/2003 | Kimura | |
| 6,542,138 B1 | 4/2003 | Shannon et al. | |
| 6,580,408 B1 | 6/2003 | Bae et al. | |
| 6,620,528 B1 | 9/2003 | Yamazaki et al. | |
| 6,661,180 B2 | 12/2003 | Koyama | |
| 6,859,193 B1 | 2/2005 | Yumoto | |
| 6,914,390 B2 | 7/2005 | Koyama | |
| 6,933,533 B2 | 8/2005 | Yamazaki et al. | |
| 6,936,844 B1 | 8/2005 | Yamazaki et al. | |
| 7,193,591 B2 | 3/2007 | Yumoto | |
| 2001/0029070 A1 | 10/2001 | Yamazaki et al. | |
| 2001/0048106 A1 | 12/2001 | Tanada | |
| 2002/0000576 A1 | 1/2002 | Inukai | |
| 2002/0014628 A1 | 2/2002 | Koyama | |
| 2002/0047581 A1 | 4/2002 | Koyama | |
| 2002/0110941 A1 | 8/2002 | Yamazaki et al. | |
| 2002/0145582 A1 | 10/2002 | Yamazaki et al. | |
| 2002/0149556 A1 | 10/2002 | Matsueda | |
| 2002/0180369 A1 | 12/2002 | Koyama | |
| 2002/0196212 A1 | 12/2002 | Nishitoba et al. | |
| 2003/0020413 A1 | 1/2003 | Oomura | |
| 2003/0058687 A1 | 3/2003 | Kimura | |
| 2004/0207615 A1 | 10/2004 | Yumoto | |
| 2005/0190177 A1 | 9/2005 | Yumoto | |

FOREIGN PATENT DOCUMENTS

| | | |
|---|---|---|
| EP | 1103946 A2 | 5/2001 |
| EP | 1130565 A1 | 9/2001 |
| JP | 09-16122 A | 1/1997 |
| JP | 10-092576 A | 4/1998 |
| JP | 11-282419 A | 10/1999 |
| JP | 2000-40924 A | 2/2000 |
| JP | 2000-56847 A | 2/2000 |
| JP | 2000-86968 A | 3/2000 |
| JP | 2000-138572 A | 5/2000 |
| JP | 2000-267164 A | 9/2000 |
| JP | 2001-5426 A | 1/2001 |
| JP | 2001-343933 A | 12/2001 |
| JP | 2002-514320 A | 5/2002 |
| JP | 2002-517806 A | 6/2002 |
| WO | WO 90/13148 A1 | 11/1990 |
| WO | WO 98/48403 A1 | 10/1998 |
| WO | WO 99/65011 A2 | 12/1999 |
| WO | WO 01/06484 A1 | 1/2001 |

OTHER PUBLICATIONS

Baldo, M.A. et al.; "Very high-efficiency green organic light-emitting devices based on electrophosphorescence"; Applied Physics Letters, vol. 75, No. 1; (1999), pp. 4-6.

Dawson, R.M.A. et al., "A Poly-Si Active-Matrix OLED Display with Integrated Drivers"; SID 99 Digest; vol. 30, pp. 438-441; 1999.

Dawson, R.M.A. et al.; "4.2: Design of an Improved Pixel for a Polysilicon Active-Matrix Organic LED Display", SID 98 Digest; vol. 29, pp. 11-14; 1998.

Dawson, R.M.A. et al.; "The Impact of the Transient Response of Organic Light Emitting Diodes on the Design of Active Matrix OLED Displays"; IEDM 98; pp. 875-878; 1998.

Hunter, I. M. et al.; "Active Matrix Addressing of Polymer Light Emitting Diodes Using Low Temperature Poly Silicon TFT's", AM-LCD 2000, pp. 249-252.

Kimura, M et al.; "Low-Temperature Poly-Si TFT Display Using Light-Emitting-Polymer"; AM-LCD 2000; pp. 245-248; 2000.

Schenk et al., Hermann; "Polymers for Light Emitting Diodes"; EuroDisplay '99; Proceedings of the 19th IDRC (International Display Research Conference), pp. 33-37; 1999.

Search Report & Written Opinion (Singapore Application No. 200205281-9) issued from the Danish Patent and Trademark Office; Jul. 19, 2004, 15 pages.

Sung Joon Bae et al.; "A Novel Pixel Design for an Active Matrix Organic Light Emitting Diode Display"; 2000 SID, Digest '00: SID International Symposium Digest of Technical Papers, vol. 31, pp. 358-361; 2000.

Tsutsui et al., Tetsuo; "Electroluminescence in Organic Thin Films; Photochemical Processes in Organized Molecular Systems"; pp. 437-450; 1991.

Tetsuo Tsutsui et al.; "High Quantum Efficiency in Organic Light-Emitting Devices with Iridium-Complex as a Triplet Emissive Center", Express Letter, JPN. J. Appl. Phys (Japanese Journal of Applied Physics), vol. 38/Part 2, No. 12B, (1999), pp. L1502-L1504.

* cited by examiner

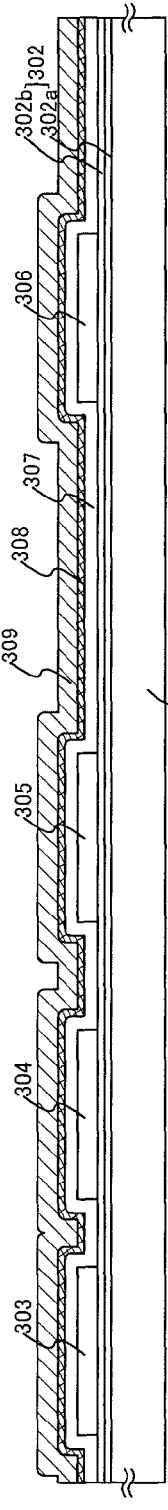
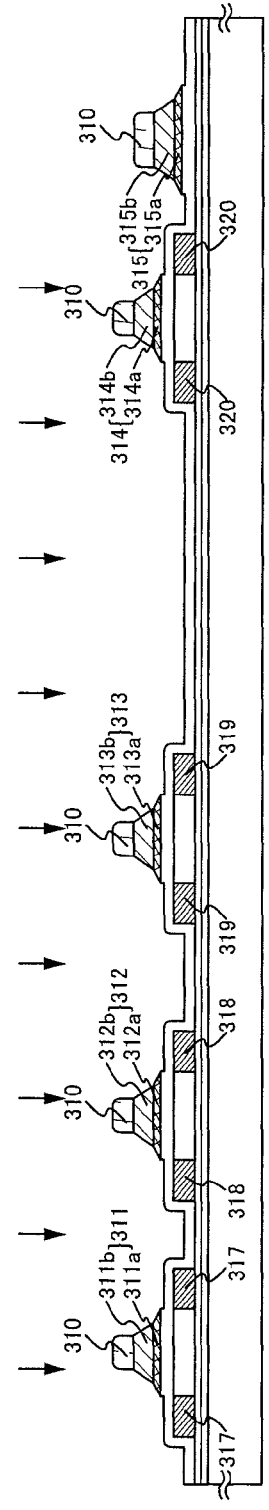
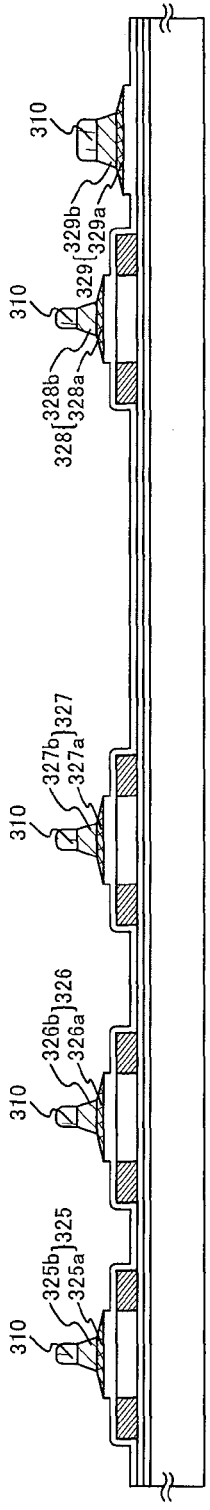
Fig. 14A
Fig. 14B
Fig. 14C

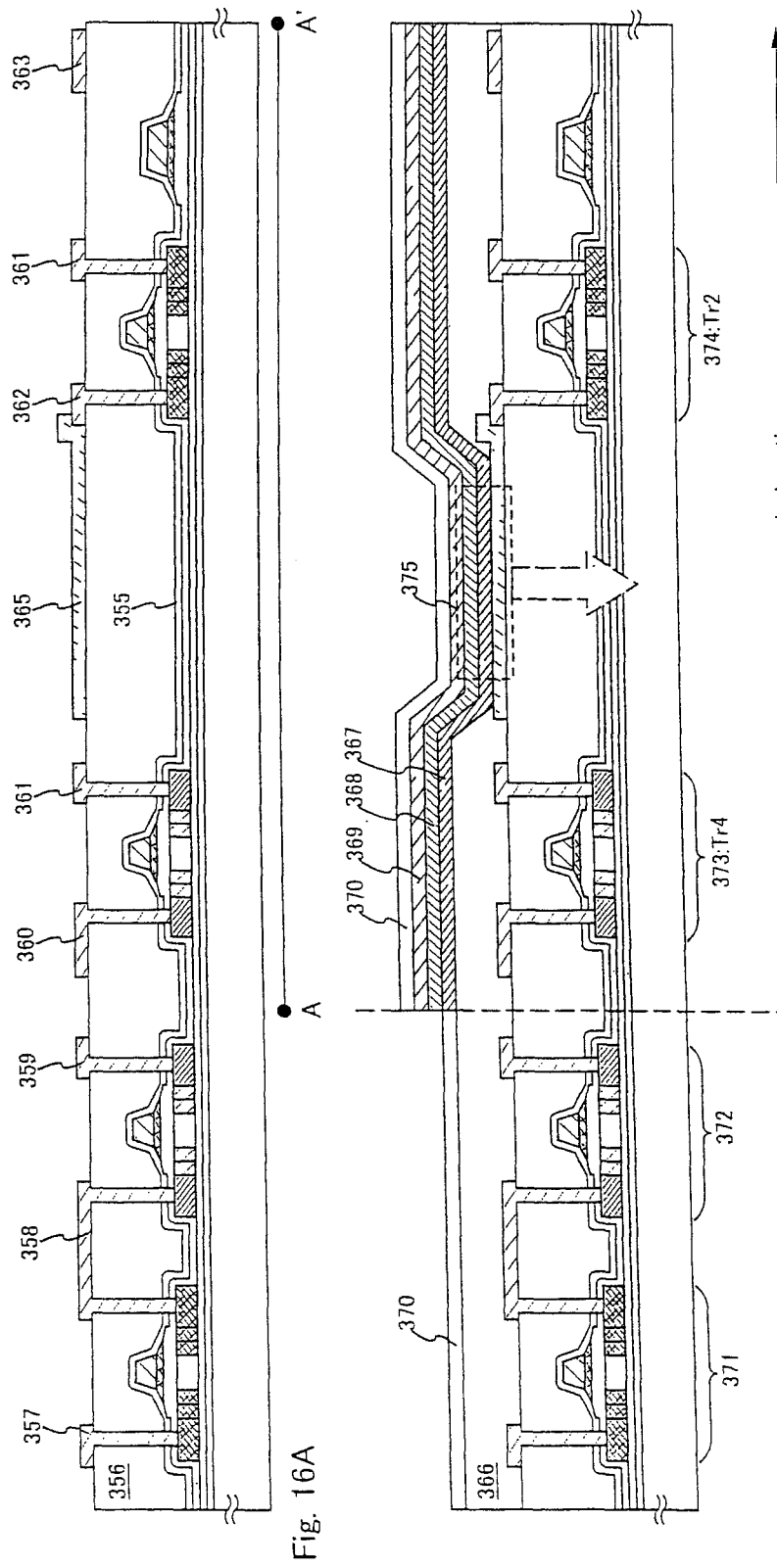

LIGHT EMITTING DEVICE, DRIVING METHOD FOR SAME AND ELECTRONIC APPARATUS

CROSS-REFERENCE TO RELATED APPLICATIONS

This application is a continuation of U.S. application Ser. No. 12/434,028, filed May 1, 2009, now U.S. Pat. No. 7,990,350, which is a continuation of U.S. application Ser. No. 11/530,204, filed Sep. 8, 2006, now U.S. Pat. No. 7,545,353, which is a continuation of U.S. application Ser. No. 11/139,441, filed May 31, 2005, now U.S. Pat. No. 7,106,006, which is a continuation of U.S. application Ser. No. 10/715,472, filed Nov. 19, 2003, now U.S. Pat. No. 6,914,390, which is a divisional of U.S. application Ser. No. 10/101,628, filed Mar. 21, 2002, now U.S. Pat. No. 6,661,180, which claims the benefit of a foreign priority application filed in Japan as Serial No. 2001-081779 on Mar. 22, 2001, all of which are incorporated by reference.

BACKGROUND OF THE INVENTION

1. Field of the Invention

The present invention relates to an OLED panel having an organic OLED (OLED: Organic Light Emitting Diode) formed on a substrate and sealed between the substrate and a cover member, and also to an OLED module mounting an IC or the like including a controller on such an OLED panel. In the present description, both an OLED panel and an OLED module are, collectively, referred to as a light-emitting device. The present invention, furthermore, relates to a driving method to a light-emitting device and an electronic apparatus using such a light-emitting device.

2. Description of the Related Art

The OLED, spontaneous to emit light, provides high visibility but does not require such a backlight as needed on a liquid-crystal display (LCD) thus optimally reducing the thickness, which is furthermore limitless in viewing angle. Consequently, the light-emitting devices using OLEDs have recently drawn attentions as the display devices taking the place of CRTs and LCDs.

The OLED has a layer containing an organic compound (organic light-emitting material) to cause electroluminescence under the application of an electric field (hereinafter, described as organic light-emitting layer), an anode and a cathode. The electroluminescence on an organic compound includes the emission of light of upon returning from a singlet excitation state into the ground state (fluorescence) and the emission of light of upon returning from a triplet excitation state into the ground state (phosphorescence). The light-emitting device of the present invention may use either one or both of such emission of light.

In the description, every layer provided between an OLED cathode and an anode is defined as an organic light-emitting layer. The organic light-emitting layer, concretely, includes a light-emitting layer, a hole injection layer, an electron injection layer, a hole transport layer and an electron transport layer. Basically, the OLED has a structure layered with an anode, a light-emitting layer and a cathode in the order. In addition to this structure, some structures possess an anode, a hole injection layer, a light-emitting layer and a cathode or an anode, a hole injection layer, a light-emitting layer, an electron transport layer and a cathode in the order.

It is problematic in placing the light-emitting device into practical application that the brightness of an OLED lowers due to deterioration in the organic light-emitting material. The organic light-emitting material is less resistive to moisture, oxygen, light and heat, and to be acceleratingly deteriorated by them. Specifically, the rate of deterioration is dependent upon a device structure for driving the light-emitting device, organic light-emitting material properties, electrode materials, conditions in a fabrication process, a driving scheme to the light-emitting device and so on.

With even a constant voltage to the organic light-emitting layer, if the organic light-emitting layer deteriorates, OLED brightness lowers. This results in obscured image display. Note that, in the description, the voltage applied from a pair of electrodes to an organic light-emitting layer is defined as an OLED drive voltage (Vel).

Meanwhile, in a color display scheme using three kinds of OLEDs corresponding to R (red), G(green) and B(blue), the organic light-emitting materials forming the organic light-emitting layer are different between the colors to which the OLEDs correspond. Consequently, there is a possibility that the OLED organic light-emitting layer deteriorates at a different rate dependently upon the color. In this case, as time elapses the brightness of OLED becomes different by the color, making impossible for the light-emitting device to display an image with a desired color.

Meanwhile, the temperature of the organic light-emitting layer relies upon the temperature of outside air or the heat generated by the OLED panel itself. However, the OLED generally has a flowing current value varying with temperature. FIG. 27 shows a change of a voltage-current characteristic of an OLED when changing the temperature of the organic light-emitting layer. At a constant voltage, when the temperature of the organic light-emitting layer increases, the OLED drive current increases. Because the OLED drive current and the OLED brightness are in a proportional relationship, the brightness on the OLED increases with the increase in the OLED drive current. In this manner, because OLED brightness varies with the temperature of the organic light-emitting layer, display is difficult at a desired gray scale. The consumption current of the light-emitting device increases with the rise of temperature.

Furthermore, because generally the change rate of OLED drive current against temperature change is different depending on the kind of an organic light-emitting material, there is a possibility in color display that the OLED brightness of each color dependently varies with temperature. The brightness balance, if disordered between the colors, makes impossible to display in a desired color.

It is an object of the present invention to provide a light-emitting device capable of obtaining a constant brightness regardless of deterioration in an organic light-emitting layer or temperature change and further of providing display with a desired color.

SUMMARY OF THE INVENTION

The present inventor has paid attentions to the fact that the lowering in OLED brightness due to deterioration is less when light is emitted while keeping the current flowing through the OLED at constant rather than when light is emitted while keeping the OLED drive voltage at constant. Note that, in the description, the current flowing through an OLED is referred to as an OLED drive current (Iel). It has been considered that the OLED brightness change due to OLED deterioration can be prevented due to control of the OLED brightness not by a voltage but by a current.

Specifically, the present invention controls the drain current Id of a transistor provided in each pixel by a signal line drive circuit. Because the transistor drain current Id is controlled in the signal line drive circuit, the drain current Id is placed constant regardless of the value of a load resistance.

When a drain current Id flows, a voltage occurs between the gate electrode and the drain region of the transistor. While maintaining the voltage, the transistor drain current is caused to flow to the OLED through a singular or a plurality of circuit elements. Incidentally, the drain current Id is in such a magnitude as operating the transistor in a saturation region.

By the above configuration, the OLED drive current flowing through the OLED is controlled in value by the signal line drive circuit regardless of the value of a load resistance. In other words, the OLED drive current can be controlled to a desired value without being affected by transistor characteristic difference, OLED deterioration or the like.

The present invention can suppress the lowering in OLED brightness by the above configuration even where an organic light-emitting layer deteriorates. As a result, a clear image can be displayed. Meanwhile, in the case of a color-display light-emitting device using OLEDs corresponding to respective colors, if the OLED organic light-emitting layer deteriorates at a rate different between the colors prevents the colors from being unbalanced in brightness, thereby displaying a desired color.

Meanwhile, even where the temperature of the organic light-emitting layer is influenced by outside-air temperature or the heat generated by the OLED panel itself, the OLED current can be controlled to a desired value. Accordingly, because the OLED drive current and the OLED brightness are in proportion, the OLED brightness can be suppressed from changing. Furthermore, consumption current can be prevented from, increasing due to temperature rise. In the case of a color-display light-emitting device, the colors are suppressed from changing in OLED brightness without being affected by temperature change. Accordingly, the colors can be prevented from being unbalanced in brightness thereby displaying a desired color.

Furthermore, because generally the change rate of OLED drive current due to temperature change is different depending on the kind of an organic light-emitting material, there is a possibility that the colors in color display variously change in OLED brightness depending on temperature. However, the light-emitting device of the present invention can obtain a desired brightness without being affected by temperature change. Accordingly, the colors are prevented from being unbalanced in brightness thus displaying a desired color.

Meanwhile, the general light-emitting device has an electric resistance on the wiring to supply current to each pixel, and hence the potential thereon somewhat drops due to wiring length. The potential drop largely differs depending on an image to be displayed. Particularly, in a plurality of pixels to be supplied by a current from the same wiring, where the ratio of the pixels having many gray scales increases, the current flowing the wiring increases to conspicuously cause potential drop. The potential drop decreases the voltage to be applied to the OLED of each pixel, hence decreasing the current to be supplied to the pixel. Accordingly, in the case to provide display in a constant gray scale on a certain predetermined pixel, when there is change in gray scale on another pixel being supplied with current through the same wiring, this causes a change in the current to be supplied to the predetermined pixel, resultingly changing the gray scale. However, the light-emitting device of the present invention can obtain a measurement value and reference value on each display image thereby correcting the OLED current. Accordingly, even where there is change in a display image, it can be displayed at a desired gray scale by the correction.

Incidentally, in the light-emitting device of the present invention, the transistor for use in the pixel may be a transistor formed using single-crystal silicon or a thin-film transistor using polysilicon or amorphous silicon. Otherwise, the transistor may use an organic semiconductor.

Incidentally, the transistor provided on the pixel of the light-emitting device of the present invention may be of a single-gate structure or a multi-gate structure, such as a double-gate structure or the higher.

BRIEF DESCRIPTION OF THE DRAWINGS

FIG. 14A to 14C are views showing a fabrication method of a light-emitting device of the present invention;

FIGS. 16A and 16B are views showing the fabrication method of a light-emitting device of the present invention;

DETAILED DESCRIPTION OF THE PREFERRED EMBODIMENTS

Embodiment Mode 1

Figure 1:
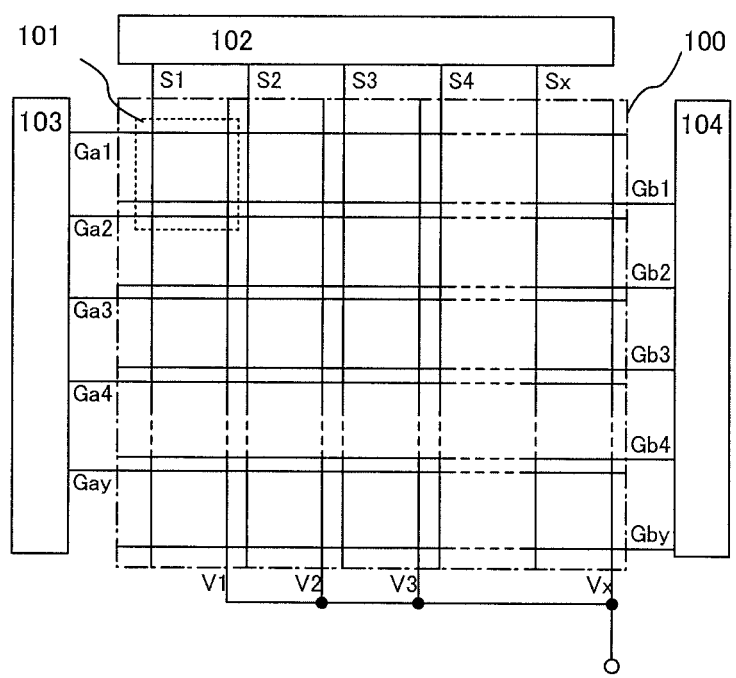
FIG. 1 is a block diagram in an upper surface of a light-emitting device of the present invention.

FIG. 1 shows a block diagram of an OLED panel structure of the present invention. 100 is a pixel section forming a plurality of pixels 101 in a matrix form. Meanwhile, 102 is a signal line drive circuit, 103 is a first scanning line drive circuit and 104 is a second scanning line drive circuit.

In FIG. 1, although the signal line drive circuit 102, the first scanning line drive circuit 103 and the second scanning line drive circuit 104 are formed on the same substrate as the pixel section 100, the present invention is not limited to that structure. The signal line drive circuit 102, the first scanning line drive circuit 103 and the second scanning line drive circuit 104 may be formed on a different substrate from the pixel section 100 and connected to the pixel section 100 through an FPC or the like. Meanwhile, in FIG. 1, although the signal line drive circuit 102, the first scanning line drive circuit 103 and the second scanning line drive circuit 104 are provided one per each, the present invention is not limited to that structure. It is possible for a designer to arbitrarily determine the number of the signal line drive circuits 102, the first scanning line drive circuits 103 and the second scanning line drive circuits 104.

Note that, in the description, connection means electrical connection.

In FIG. 1, on the pixel section 100, there are provided signal lines S1-Sx, power lines V1-Vx, first scanning lines Ga1-Gay and second scanning lines Gb1-Gby. The signal lines and the power lines are not necessarily the same in the number. The first scanning lines and the second scanning lines are not necessarily the same in the number. The light-emitting device of the present invention not necessarily requires to have all of these lines. Other lines may be provided besides those lines.

The power lines V1-Vx are held at a predetermined potential. Although FIG. 1 shows a light-emitting device structure to display monochromatic images, the present invention may be a light-emitting device to display color images. In such a case, the potentials on the power lines V1-Vx must not be held all in the same height but may be changed based on the corresponding colors.

Figure 2:
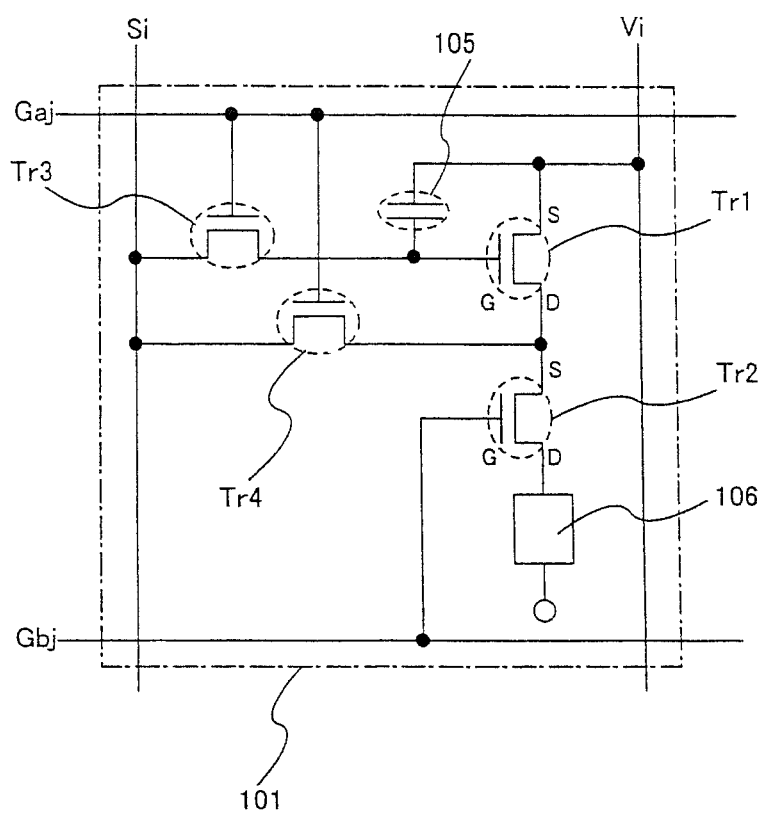
FIG. 2 is a circuit diagram of the pixel of the light-emitting device of the present invention.

FIG. 2 shows a detailed configuration of the pixel 101 shown in FIG. 1. The pixel 101 shown in FIG. 2 has a signal line Si (one of S1-Si), a first scanning line Gaj (one of Ga1-Gay), a second scanning line Gbj (one of Gb1-Gby) and a power line Vi (one of V1-Vx).

The pixel 101 has a transistor Tr1 (current-control or first transistor), a transistor Tr2 (driving or second transistor), a transistor Tr3 (first switching or third transistor), a transistor Tr4 (second switching or fourth transistor), an OLED 106 and a storage capacitor 105.

The gate electrodes of the transistors Tr3 and Tr4 are both connected to the first scanning line Gaj.

One of the source and drain regions of the transistor Tr3 is connected to the signal line Si while the other is to the gate electrode of the transistor Tr1. Meanwhile, one of the source and drain regions of the transistor Tr4 is connected to the signal line Si while the other is to the drain region of the transistor Tr1.

The source region of the transistor Tr1 is connected to the power line Vi while the drain region thereof is connected to the source region of the transistor Tr2. The gate electrode of the transistor Tr2 is connected to the second scanning line Gbj. The drain region of the transistor Tr2 is connected to the pixel electrode possessed by the OLED 106.

The OLED 106 has an anode and a cathode. In the description, the cathode is referred to as a counter electrode (second electrode) where the anode is used as a pixel electrode (first electrode) and the anode is referred to as a counter electrode where the cathode is used as a pixel electrode.

The potential on the counter electrode is kept at a constant height.

Note that the transistor Tr3 and the transistor Tr4 may be n-channel transistors or p-channel transistors. However, the transistor Tr3 and the transistor Tr4 have the same polarity.

Meanwhile, the transistors Tr1 and Tr2 each may be either an n-channel transistor or a p-channel transistor. However, the transistors Tr1 and Tr2 have the same polarity. In the case of using the anode as a pixel electrode and the cathode as a counter electrode, the transistors Tr1 and Tr2 are p-channel transistors. Conversely, where the anode is used as a counter electrode and the cathode as a pixel electrode, the transistors Tr1 and Tr2 are n-channel transistors.

The storage capacitor 105 is formed between the gate electrode of the transistor Tr1 and the power line Vi. The storage capacitor 105, provided to maintain a voltage between the gate electrode and the source region of the transistor Tr1 (gate voltage), is not necessarily provided.

Embodiment Mode 2

Now, explanation will be made on the drive to the light-emitting device shown in FIG. 2, using FIG. 3. In the present embodiment mode, the operation of each pixel of the light-emitting device shown in FIG. 2 is explained by separating with a write period Ta and a display period Td.

In the write period Ta, the first scanning line Gaj is selected. When the first canning line Gaj is selected, the transistors Tr3 and Tr4 connected at their gate electrode to the first scanning line Gaj turn on. Note that, in the write period Ta, the second scanning line Gbj is not selected and hence the Tr2 is off.

On the basis of a potential of a video signal inputted to the signal line drive circuit 102, constant currents Ic flow respectively between the signal lines S1-Sx and the power lines V1-Vx. Note that, in the description, the current Ic is referred to as a signal current.

Figure 3A:
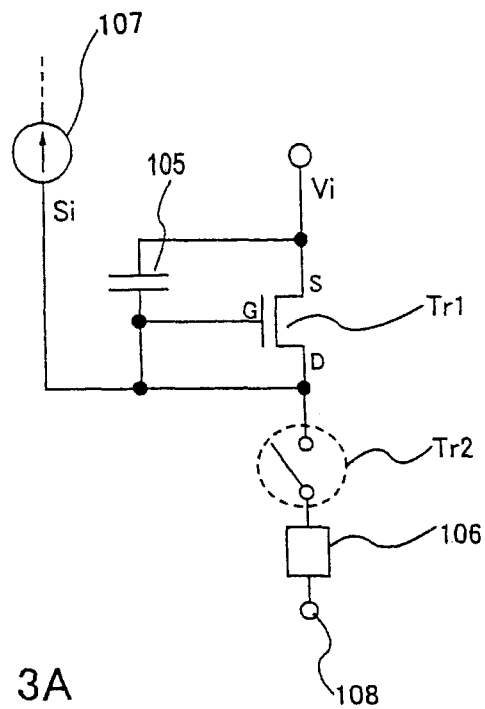
FIGS. 3A and 3B are schematic diagrams of the pixel under driving.

FIG. 3A shows a schematic diagram of the pixel 101 that, in the write period Ta, a constant current Ic flows on the signal line Si. 107 means a constant-current source possessed by the signal line drive circuit 102. Meanwhile, 108 is a connection terminal to a power source for giving a potential to the counter electrode.

In the write period Ta, the transistors Tr3 and Tr4 are in an on state. Accordingly, when a constant current Ic flows to the signal line Si, the constant current Ic flows between the source and drain regions of the transistor Tr1. At this time, the current Ic is controlled in its magnitude by the constant current source 107 so as to operate the transistor Tr1 in a saturation region.

In the saturation region, provided that $V_{GS}$ is a potential difference between the gate electrode and the source region (gate voltage), μ is a transistor mobility, $C_0$ is a gate capacitance per unit area, W/L is a ratio of a channel width W to a channel length L in the channel region, $V_{TH}$ is a threshold value, μ is a mobility and Id is a drain current of the transistor Tr1, the following Equation 1 is held.

$$Id = \mu C_0 W/L (V_{GS} - V_{TH})^2 / 2 \qquad \text{Equation 1}$$

In Equation 1, μ, $C_0$, W/L and $V_{TH}$ are fixed values as determined by the individual transistor. Meanwhile, the drain current Id of the transistor Tr1 is held Ic=Id by the constant current source 107. Accordingly, as can be seen from Equation 1, the gate voltage $V_{GS}$ of the transistor Tr1 is determined by a value of signal current Ic.

When the write period Ta terminates, a display period Td commences. In the display period Td, the first scanning line Gaj is not selected but the second scanning line Gbj is selected.

Figure 3B:
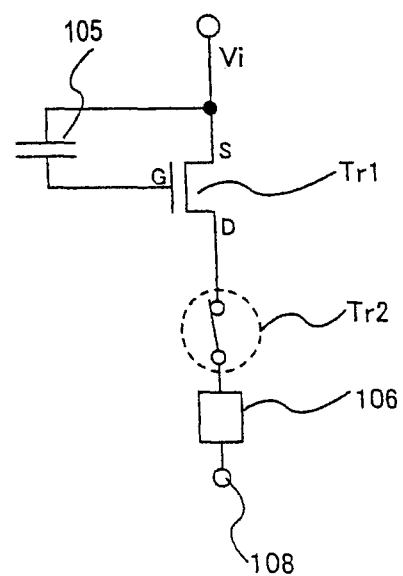

FIG. 3B shows a schematic diagram of the pixel in the display period Td. The transistor Tr3 and the transistor Tr4 are off. Meanwhile, the transistor Tr2 is on.

In the display period Td, the transistor Tr1 is maintained with $V_{GS}$, as it is, determined in the write period Ta. Consequently, the drain current Id in value of the transistor Tr1 remains at the same value as the signal current Ic. Meanwhile, because the transistor Tr2 is on, the drain current Id flows to the OLED 106 through the transistor Tr2. Consequently, in the display period Td, an OLED drive current having the same magnitude as the signal current Ic flows to the OLED 106 and the OLED 106 emits light at a brightness commensurate with the magnitude of the OLED drive current.

Write period Ta and display period Td occur on all the pixels. The timing of occurrence differs from pixel to pixel on each line. Note that, in the description, all the pixels having the same first scanning line or the same second scanning line of among a plurality of pixels possessed by the pixel section are referred to as the pixels on the same line.

In the case with a driving method using an analog video signal (analog driving method), the magnitude of Ic is determined by the analog video signal to cause the OLED 106 to emit light at a brightness commensurate with the magnitude of Ic, thereby providing tonal representation. In this case, one image is displayed by the occurrence of one write period Ta and one display period Td on all the pixels. The duration of from a commencement of write period Ta on any one pixel to a termination of display period Td on all the pixels is referred to as a frame period. The successive frame periods are overlapped one with another.

Figure 4:
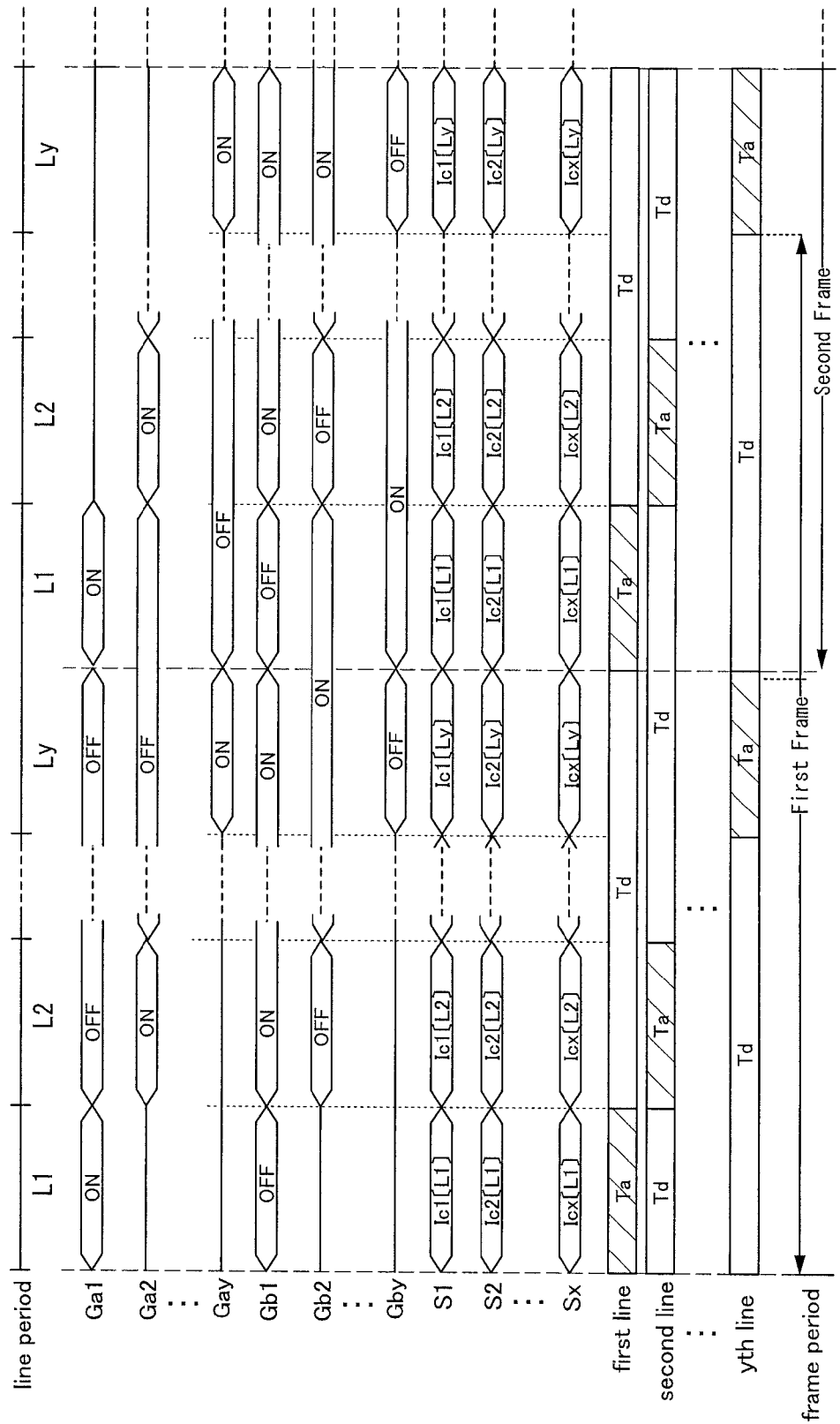
FIG. 4 is a chart showing the occurrence of a write period and display period in an analog driving method.

FIG. 4 shows one example of a timing chart in the analog driving method. One frame period has line periods in the number of y, wherein each first scanning line is selected in each line period. In the line period, a predetermined signal current Ic (Ic1-Icx) flows on each signal line. In FIG. 4, the value of a signal current flowing on each signal line in the line period Lj (j=1–y) is represented as Ic1 [Lj]-Icx [Lj].

The start timing of the write period Ta and display period Td deviates from pixel to pixel on each line so that there is no overlap in the timing of write period occurrence between the pixels on each line.

On the other hand, in the case with a time-gray scale driving method using a digital video signal (digital driving method), a write period Ta and display period Td repeatedly occurs during one frame period on each pixel, thereby making possible to display one image. Where an image is displayed by an n-bit video signal, at least write periods in the number of n and display periods in the number of n corresponding to each bit are provided in one frame period. The write periods (Ta1-Tan) in the number of n and the display periods (Td1-Tdn) in the number of n correspond to each bit of the video signal.

Figure 5:
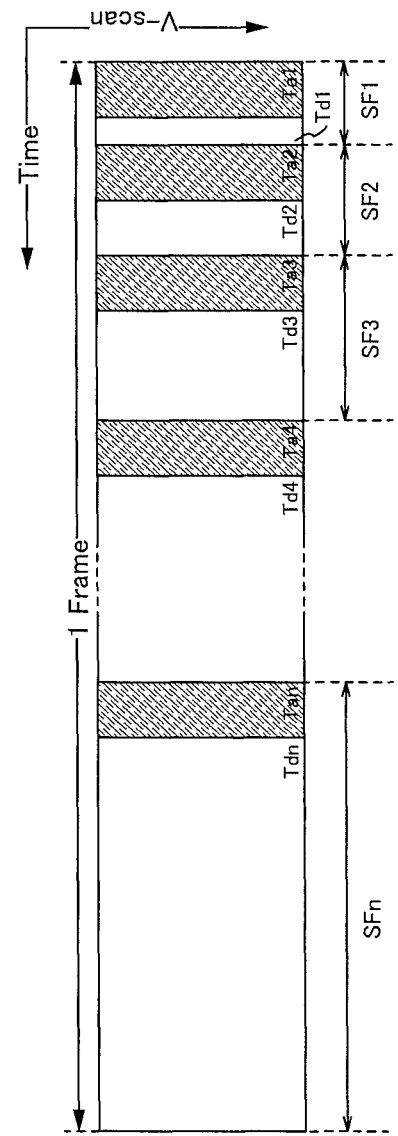
FIG. 5 is a chart showing the occurrence of a write period and display period in a digital driving method.

FIG. 5 shows the timing that write periods (Ta1-Tan) in the number of n and display periods (Td1-Tdn) in the number of n occur in one frame period. The horizontal axis represents a time while the vertical axis represents a position of the first scanning line possessed by the pixel.

Next to the write period Tam (m: arbitrary number of 1–n), a display period occurs that corresponds to the same bit number, i.e. Tdm in this case. The write period Ta and the display period Td are, collectively, referred to as a sub-frame time SF. The sub-frame period having a write period Tam and display period Tdm corresponding to m-th bit is given SFm.

The length of a display time Td1-Tdn satisfies Td1: Td2: . . . :Tdn=$2^0$:$2^1$: . . . :$2^{n-1}$.

Note that, in order to improve the image quality on display, the sub-frame period long in display duration may be divided into a certain segments. How to concretely divide is disclosed in Japanese Patent Application No. 2000-267164 which can be referred.

In the driving method shown in FIG. 5, gray scale is controlled by controlling the sum in length of the display periods of light emission within one frame period.

In the present invention, the above configuration can suppress the lowering in OLED brightness even where the organic light-emission layer is deteriorated. As a result, a clear image can be displayed. Meanwhile, in the case of a color-display light-emitting device using OLEDs corresponding to respective colors, even where the OLED light-emitting layers deteriorate at different rate depending on the corresponding colors, the colors are prevented from being unbalanced in brightness thereby enabling to display a desired color.

Meanwhile, even if the temperature of the organic light-emitting layer be affected by outside-air temperature or the heat caused due to the OLED panel itself, the OLED drive current can be controlled to a desired value. Consequently, because the OLED drive current and the OLED brightness are in proportion, the OLED brightness can be prevented from changing. Also, consumption current can be prevented from increasing with rise in the temperature. In the case of a color-display light-emitting device, the OLED brightness on each color can be suppressed from changing irrespectively of temperature change. Accordingly, the colors can be prevented from being unbalanced in brightness, enabling display with a desired color.

Furthermore, because generally the change rate of OLED drive current due to temperature change is different depending on the kind of an organic light-emitting material, there is a possible case that the OLED brightness on each color randomly varies with temperature. However, in the light-emitting device of the present invention, because a desired brightness can be obtained without being affected by temperature change, the colors can be prevented from being unbalanced in brightness thereby enabling to display a desired color.

Meanwhile, because the general light-emitting device has electric resistance in the wiring itself for supplying current to each pixel, somewhat potential drop occur due to the length of the wiring. The potential drop largely differs depending also upon an image to be displayed. Particularly, on a plurality of pixels to be supplied with current through the same wiring, when the ratio of the pixel having many gray scales increases, the current flowing on the wiring increases to cause potential drop conspicuously. When the potential drops, the voltage applied to OLED of the pixel decreases to decrease the current to be supplied to the pixel. Accordingly, in the case to display at a certain gray scale on a certain predetermined pixel, when there is change in gray scale on another pixel being supplied with current through the same wiring, the current being supplied to the predetermined pixel changes to resultingly change the gray scale. However, the light-emitting device of the present invention can obtain a measurement value and reference value on each pixel to be displayed, thereby correcting the OLED current. It is therefore possible to display at a desired gray scale even if there is change in display image.

Embodiment Mode 3

Figure 6:
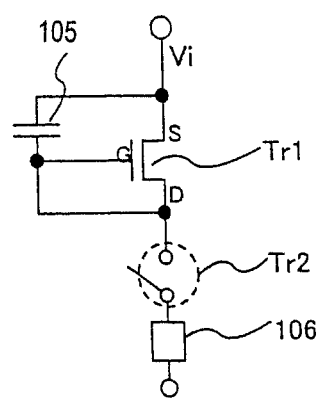
FIG. 6 is a schematic diagram of the pixel under driving.

This embodiment mode explains an embodiment mode different from Embodiment Mode 2 of driving the light-emitting device of FIG. 2, using FIG. 6. In this embodiment mode, the operation of each pixel of the light-emitting device of FIG. 2 will be explained by separating with a write period Ta, a display period Td and a non-display period Te. Note that, because the operation on the pixel in the write period Ta and display period Td has already been explained in Embodiment Mode 2, explanation will be herein made on the operation on the pixel in a non-display period Te.

The non-display period Te occurs after terminating a display period Td and before an occurrence of a display period Td. In the non-display period Td, the first scanning, line Gaj and the second scanning line Gbj are not selected.

FIG. 6 shows a schematic diagram of the pixel in a non-display period Te. The transistor Tr3 and the transistor Tr4 are off. Meanwhile, the transistor Tr2 is also off. Accordingly, no OLED drive current flows to the OLED 106, and hence the OLED 106 will not emit light.

A non-display period Te not always occurs following the display period Td. However, in such a case that the display period terminates on the pixels on the first line before the write period terminates on all the lines, a non-display period occurs after the display period.

The driving method of this embodiment mode is used mainly in the drive with a digital video signal. In the driving method for time gray scale using a digital video signal (digital driving method), a write period Ta and a display period Td repeatedly occur on each pixel in one frame period, thereby enabling to display one image. In the case of displaying an image by an n-bit video signal, at least write periods in the number of n and display periods in the number of n are provided in one frame period. The write periods in the number of n (Ta1-Tan) and display periods hi the number of n (Td1-Tdn) correspond to each bit of a video signal.

Figure 7:
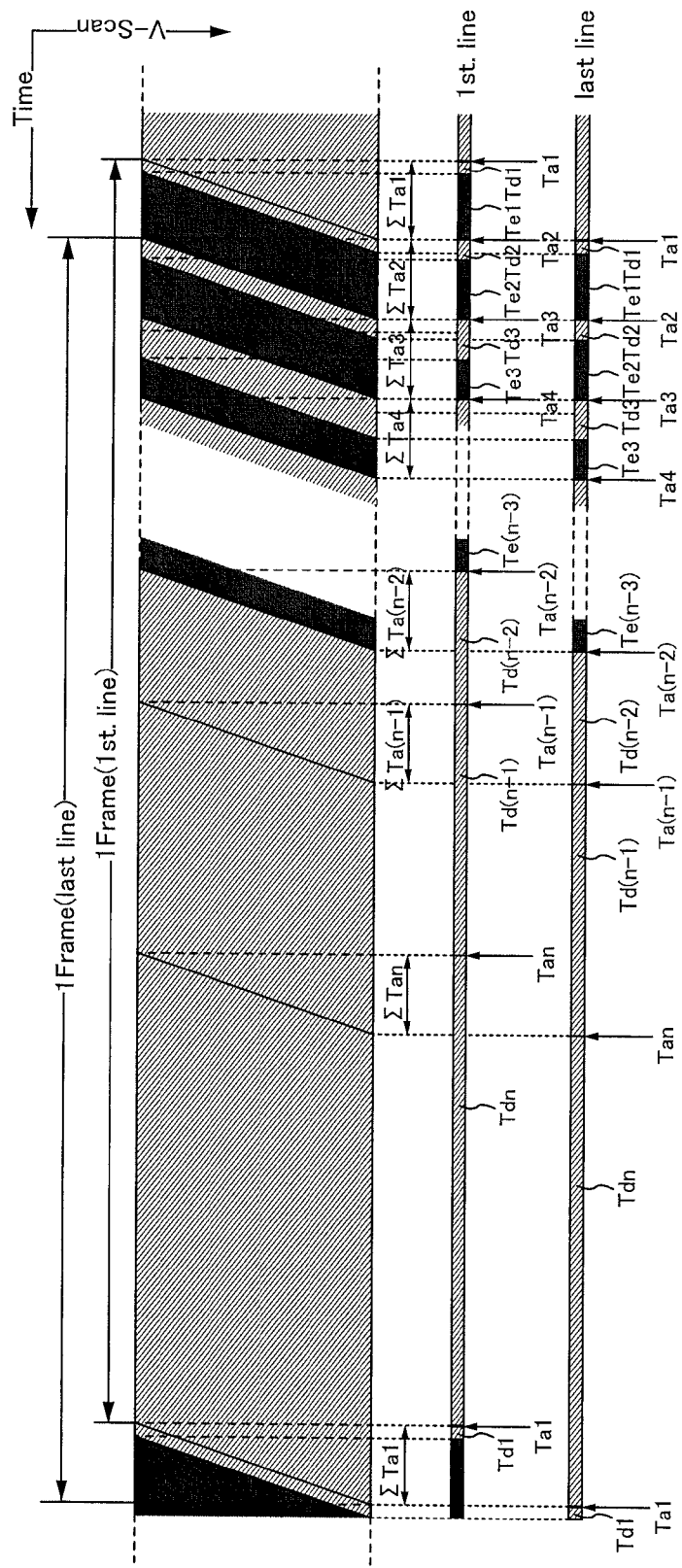
FIG. 7 is a chart showing the occurrence of a write period and display period in a digital driving method.

FIG. 7 shows the occurrence timing of write periods in the number of n (Ta1-Tan), display periods in the number of n (Td1-Tdn) and one non-display period (Te1-Te1) within one frame period. Note that this embodiment mode explains on the case of 1=n-3 in order to simplify explanation. The horizontal axis represents a time while the vertical axis represents a position of the first scanning line possessed by the pixel. Meanwhile, because write period is short, the commencement timing of a write period Ta1-Tan corresponding to each bit is denoted at an arrow in order for easily seeing the figure. Meanwhile, the period, for each bit, of from a commencement of a write period to the pixel on the first line to a termination of a write period to the pixel on a y-th line is shown with ΣTa1-ΣTan.

In a write period Ta1, the drain current of the transistor Tr1 is controlled by a first-bit digital video signal in the order of from the pixel on the first line. Next, when a display period Td1 commences, the transistors Tr3 and Tr4 turn off and the transistor Tr2 turns on in the order of from the pixel on the first line, thereby flowing a drain current through the OLED 106. Consequently, the OLED 106 is placed in a light emission or non-emission state.

Then, a non-display period Te1 commences so that the transistor Tr2 turns into an off state while the transistors Tr3 and Tr4 remain off in the order of from the pixel on the first line. Accordingly, the drain current becomes not to flow through the OILED 106 and hence the OLED 106 goes into an off state.

Then, a write period Tat commences to repeat the foregoing operation until the non-display period Te (n−3) terminates.

When the non-display period Te (n−3) terminates, a write period Ta (n−2) commences whereby the drain current of the transistor Tr1 is controlled by a (n−2)-th bit digital video signal in the order of from the pixel on the first line. When a display period Td (n−2) then commences, the transistors Tr3 and Tr4 turn off and the transistor Tr2 turns on in the order of from the pixel on the first line, thereby flowing a drain current through the OLED 106. Consequently, the OLED 106 is placed in a state of light emission or non-emission.

Then, a write period Ta (n−1) commences to repeat the foregoing operation until the display period Tdn terminates.

After Tdn terminates on the pixels of the first line, one frame period completes. Again a write period Ta1 in the next frame period commences on the pixel of the first line. Thus, the foregoing operation is again repeated. The commencement timing and termination timing of one frame period has time difference between the pixels of each line.

When the display period Tdn terminates on all the pixels, one image can be displayed.

Incidentally, it is assumed that the display period length is $Td1:Td2:Td3: \ldots Td(n-1):Tdn = 2^0:2^1:2^2: \ldots :2^{(n-2)}:2^{(n-1)}$. The combination of such display periods provides a representation at a desired gray scale of among $2^n$ gray scales.

Embodiment

Explanations will be made below on the examples of the present invention.

Embodiment 1

This embodiment explains a pixel configuration different from that of the light-emitting device of the present invention of FIG. 2.

The OLED panel possessed by the light-emitting device of the present invention does not have a second scanning line drive circuit differently from the OLED panel shown in FIG. 1. Note that, in this embodiment, the first scanning line drive circuit is referred simply to as a scanning line drive circuit.

The OLED panel of this embodiment has a pixel section forming a plurality of pixels in a matrix form, a signal line drive circuit and a scanning line drive circuit.

The signal line drive circuit and the scanning line drive circuit may be formed on the same substrate as the pixel section. Otherwise, they may be formed on respective different substrates and connected to the pixel section through FPCs or the like. Meanwhile, it is possible for a designer to arbitrarily determine the number of signal line drive circuits and scanning line drive circuits.

In the pixel section, there are provided signal lines S1-Sx, power lines V1-Vx and scanning lines G1-Gy. Note that the signal lines and the power lines are not necessarily the same in the number. The light-emitting device of the present invention not necessarily requires all of these lines, and other wirings than those may be provided.

The power lines V1-Vx are held at a predetermined potential. The power lines V1-Vx, in all, do not require the same height of potential.

Figure 8:
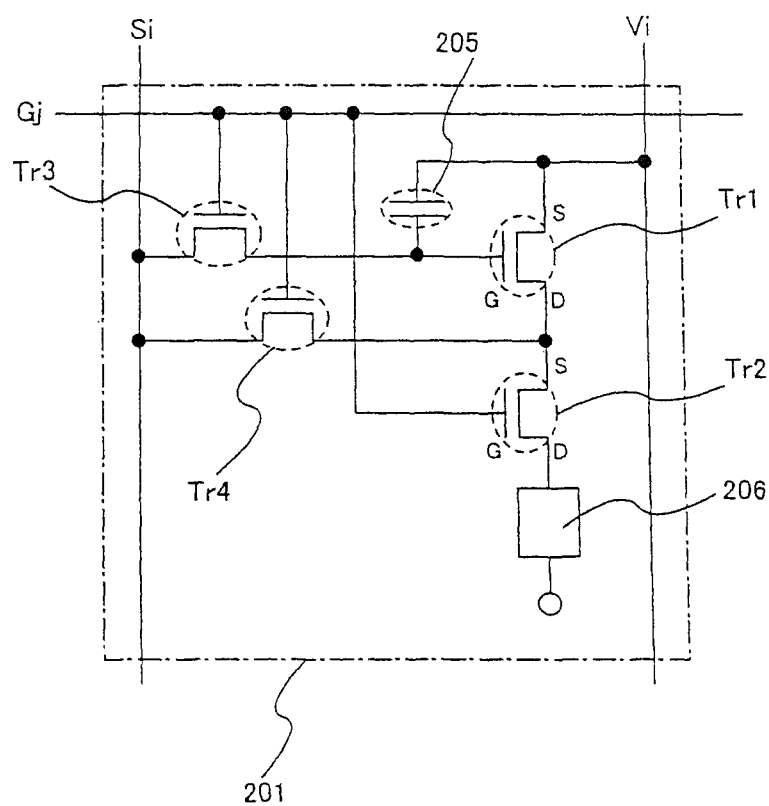
FIG. 8 is a circuit diagram of the pixel of a light-emitting device of the present invention.

FIG. 8 shows a concrete configuration of a pixel in this embodiment. The pixel 201 shown in FIG. 8 has a signal line Si (one of S1-Sx), a scanning line Gj (one of G1-Gy) and a power line Vi (one of V1-Vx).

The pixel 201 has also a transistor Tr1 (current control or first transistor), a transistor Tr2 (driving or second transistor), a transistor Tr3 (first switching or third transistor), a transistor Tr4 (second switching or fourth transistor), an OLED 206 and a storage capacitor 205.

The gate electrodes of the transistors Tr3 and Tr4 are both connected to the scanning line Gj.

One of the source and drain regions of the transistor Tr3 is connected to the signal line Si and the other is connected to the gate electrode of the transistor Tr1. Meanwhile, one of the source and drain regions of the transistor Tr4 is connected to the signal line Si and the other is connected to the drain region of the transistor Tr1.

The source region of the transistor Tr1 is connected to the power line Vi and the drain region thereof is connected to the source region of the transistor Tr2. The gate electrode of the transistor Tr2 is connected to the scanning line Gj. The drain region of the transistor Tr2 is connected to the pixel electrode possessed by the OLED 206.

The OLED 206 has an anode and a cathode.

The potential on the counter electrode is held at a constant height.

Note that the transistors Tr3 and Tr4 may be n-channel transistors or p-channel transistors. However, the transistor Tr3 and the transistor Tr4 are the same in polarity.

Meanwhile, the transistors Tr1 and Tr2 have a polarity reverse to that of the transistors Tr3 and Tr4. Consequently, when the transistors Tr3 and Tr4 are on, the transistor Tr2 is off. Conversely, when the transistors Tr3 and Tr4 are off, Tr2 is on.

In the case of using the anode as a pixel electrode and the cathode as a counter electrode, the transistors Tr1 and Tr2 are p-channel transistors. Conversely, where using the anode as a counter electrode and the cathode as a pixel electrode, the transistors Tr1 and Tr2 are n-channel transistors.

The storage capacitor 205 is formed between the gate electrode of the transistor Tr1 and the power line Vi. The storage capacitor 205 may not necessarily be provided although provided in order to maintain a voltage of between the gate electrode and the source region of the transistor Tr1 (gate voltage).

The pixel shown in FIG. 8 operates by the driving method shown in Embodiment Mode 2. Namely, as shown in FIG. 3, the operation can be explained by separation with a write period and a display period. Incidentally, the detailed operating manner on the pixel can be referred to Embodiment Mode 2, and hence is omitted herein.

Embodiment 2

This embodiment explains a configuration of a pixel of the light-emitting device of the present invention different from that of FIG. 2 or 8.

The OLED panel possessed by the light-emitting device of this embodiment has a pixel section forming a plurality of pixels in a matrix form, a signal line drive circuit, a first scanning line drive circuit and a second scanning line drive circuit, similarly to the OLED panel shown in FIG. 1.

The signal line drive circuit, the first scanning line drive circuit and the second scanning line drive circuit may be formed on the same substrate as the pixel section. Otherwise, they may be formed respectively on different substrates and connected to the pixel section through FPCs or the like. Meanwhile, it is possible for a designer to arbitrarily determine the number of signal line drive circuits, first scanning line drive circuits and second scanning line drive circuits.

In the pixel section, there are provided signal lines S1-Sx, power lines V1-Vx, first scanning lines Ga1-Gay and second scanning lines Gb1-Gby. Note that the signal lines and the power lines are not necessarily the same in the number. Meanwhile, the first scanning lines and the second scanning lines are not necessarily the same in the number. The light-emitting device of the present invention not necessarily requires to have all of these lines. Other wirings may be provided besides those wirings.

The power lines V1-Vx are held at a predetermined potential. The power lines V1-Vx in all do not require the same height of potential.

Figure 9:
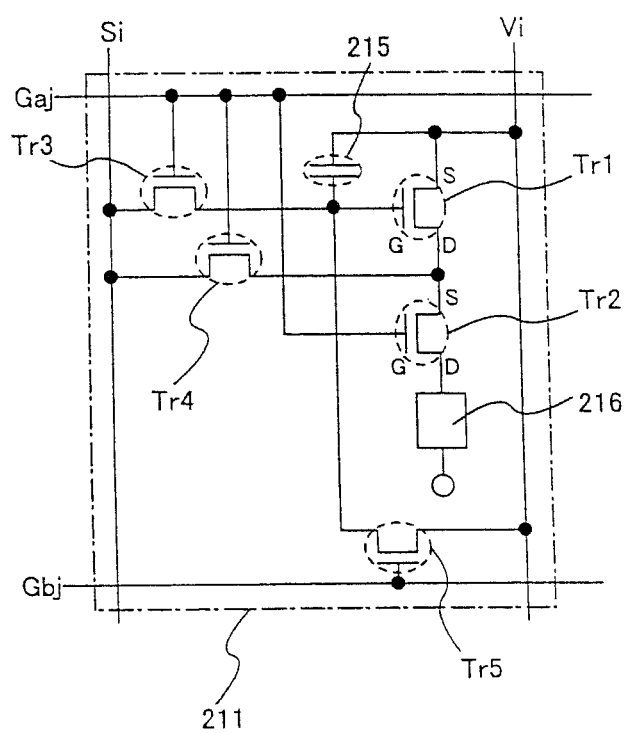
FIG. 9 is a circuit diagram of the pixel of a light-emitting device of the present invention.

FIG. 9 shows a concrete configuration of a pixel in this example. The pixel 211 shown in FIG. 9 has a signal line Si (one of S1-Sx), a first scanning line Gaj (one of Ga1-Gay), a second scanning line Gbj (one of Gb1-Gby) and a power line Vi (one of V1-Vx).

The pixel 211 also has a transistor Tr1 (current control or first transistor), a transistor Tr2 (driving or second transistor), a transistor Tr3 (first switching or third transistor), a transistor Tr4 (second switching or fourth transistor), a transistor Tr5 (erasing or fifth transistor), an OLED 216 and a storage capacitor 215.

The gate electrodes of the transistors Tr3 and Tr4 are both connected to the first scanning line Gaj.

One of the source and drain regions of the transistor Tr3 is connected to the signal line Si while the other is connected to the gate electrode of the transistor Tr1. Meanwhile, one of the source and drain regions of the transistor Tr4 is connected to the signal line Si while the other is connected to the drain region of the transistor Tr1.

The source region of the transistor Tr1 is connected to the power line Vi and the drain region thereof is connected to the source region of the transistor Tr2. The gate electrode of the transistor Tr2 is connected to the first scanning line Gaj. The drain region of the transistor Tr2 is connected to the pixel electrode possessed by the OLED 216.

The gate electrode of the transistor Tr5 is connected to the second scanning line Gbj. One of the source and drain regions of the transistor Tr5 is connected to the power line Vi while the other is connected to the gate electrode of the transistor Tr1.

The OLED 206 has an anode and a cathode.

The potential on the counter electrode is held at a constant height.

Note that the transistors Tr3 and Tr4 may be n-channel transistors or p-channel transistors. However, the transistor Tr3 and the transistor Tr4 are the same in polarity.

Meanwhile, the transistors Tr1 and Tr2 have a polarity reverse to that of the transistors Tr3 and Tr4. Consequently, when the transistors Tr3 and Tr4 are on, the transistor Tr2 is off. Conversely, when the transistors Tr3 and Tr4 are off, Tr2 is on.

In the case of using the anode as a pixel electrode and the cathode as a counter electrode, the transistors Tr1 and Tr2 are p-channel transistors. Conversely, where using the anode as a counter electrode and the cathode as a pixel electrode, the transistors Tr1 and Tr2 are n-channel transistors.

The storage capacitor 215 is formed between the gate electrode of the transistor Tr1 and the power line Vi. The storage capacitor 215 may not necessarily be provided although provided in order to maintain a voltage of between the gate electrode and the source region of the transistor Tr1 (gate voltage).

The pixel shown in FIG. 9 operates on the driving method shown in Embodiment Mode 3. However, in the case of the pixel shown in FIG. 9, the operation on the pixels in a non-display period is different from that shown in FIG. 6. In the pixel of FIG. 9, by turning on the transistor Try in the non-display period, the gate voltage Tr1 goes near to 0, and hence Tr1 turns off. Because the transistor Tr2 is on but Tr1 is off, an OLED drive current does not flow through the OLED 216 and hence the OLED 216 turns off. Consequently, it is possible to explain the operation by separation with a write period, a display period and a non-display period. Incidentally, concrete drive timing can be referred to Embodiment Mode 3 and hence is omitted herein.

Embodiment 3

This example describes an order sub-frame periods SF1 to SFn turn up in a driving method shown in Embodiment Mode 2.

Figure 10:
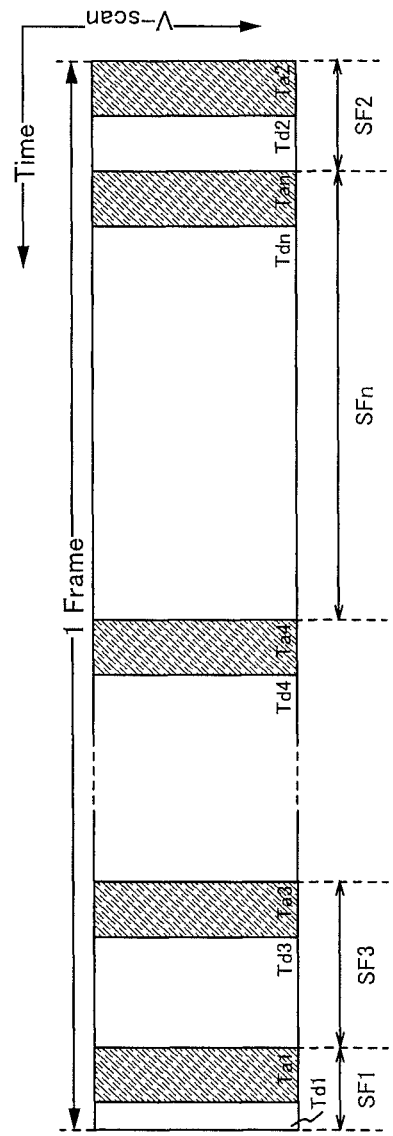
FIG. 10 is a chart showing the occurrence of a write period and display period in the digital driving method.

FIG. 10 shows at which points n writing periods (Ta1 to Tan) and n display periods (Td1 to Tdn) are started in one frame period. The horizontal axis indicates time whereas the vertical axis indicates positions of the first scanning lines of pixels. Descriptions on details about how the pixels operate are omitted here but can be found in Embodiment Mode 2.

According to the driving method of this embodiment, the sub-frame period that has the longest display period in one frame period (in this example, SFn) does not come first or last in the one frame period. In other words, the sub-frame period that has the longest display period in one frame period is interposed between other sub-frame periods of the same frame period.

This makes it difficult for the human eye to recognize uneven display caused by light emission in close display periods in adjacent frame periods when an image is displayed with intermediate gradations.

The structure of this example is effective when n≥3. This embodiment may be combined freely with Embodiment Mode 1.

Embodiment 4

This example describes a driving method which is different from those illustrated in Embodiment 3.

Figure 11:
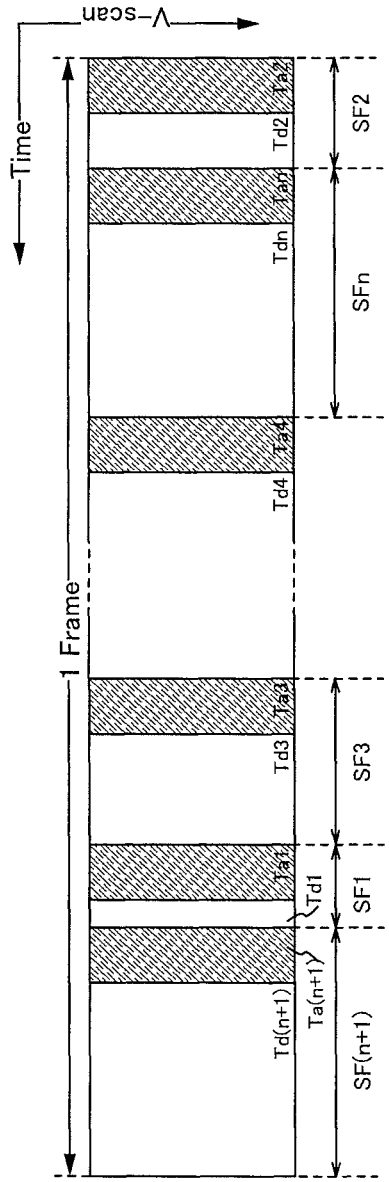
FIG. 11 is a chart showing the occurrence of a write period and display period in the digital driving method.

FIG. 11 shows at which points n+1 writing periods (Ta1 to Ta (n+1)) and n+1 display periods (Td1 to Td (n+1)) are started in one frame period. The horizontal axis indicates time whereas the vertical axis indicates positions of the first scanning lines of pixels. Descriptions on details about how the pixels operate are omitted here but can be found in Embodiment Mode 2.

In this embodiment, one frame period has n+1 sub-frame periods SF1 to SF (n+1) in accordance with n bit digital video signals. The sub-frame periods SF1 to SF (n+1) have n+1 writing periods (Ta1 to Ta (n+1)) and n+1 display periods (Td1 to Td (n+1)).

A writing period Tam (m is an arbitrary number ranging from 1 to n+1) and a display period Tdm make a sub-frame period SFm. The writing period Tam is followed by a display period associated with the same bit number, in this case, the display period Tdm.

The sub-frame periods SF1 to SF (n−1) are respectively associated with 1 bit digital video signals to (n−1) bit digital video signals. The sub-frame periods SFn and SF (n+1) are both associated with the n-th bit digital video signals.

The sub-frame periods SFn and SF (n+1) that are for digital video signals of the same bit number do not immediately follow each other in this example. In other words, the sub-frame periods SFn and SF (n+1) that are for digital video signals of the same bit number sandwich another sub-frame period.

A writing period Ta and a display period Td are repeatedly alternated in one frame period to make it possible to display one image.

Lengths of the display periods Td1 to Td (n+1) are set so as to satisfy Td1:Td2: . . . :(Tdn+Td(n+1))=$2^0:2^1: \ldots :2^{n-1}$.

According to the driving method of the present invention, gradation display is obtained by controlling the total light emission time of a pixel in one frame period, namely, for how many display periods in one frame period the pixel emits light.

The above structure makes the uneven display in intermediate gradation display less recognizable to the human eye than in the cases illustrated in FIGS. 5 and 10. The uneven display is caused by adjoining display periods during which light is emitted in adjacent frame periods.

Described in this embodiment is the case in which two sub-frame periods are provided for digital video signal of the same bit. However, the present invention is not limited thereto. Three or more sub-frame periods may be provided for the same bit in one frame period.

Although a plurality of sub-frame periods are provided for the most significant bit digital video signal in this embodiment, the present invention is not limited thereto. A digital video signal of other bit than the most significant bit may have a plurality of sub-frame periods. There is no need to limit the number of digital video signal bits that can have a plurality of sub-frame periods to one. A digital video signal of certain bit and a digital video signal of another bit can respectively have plural sub-frame periods.

The structure of this embodiment is effective when n≥2. This example can be combined freely with Embodiments 1 and 3.

Embodiment 5

This embodiment explains the sequence of occurrence in the driving method shown in Embodiment Mode 3. Note that this embodiment explains the case with n=6 and l=5. Incidentally, the example explains mere one example of a driving method of the present invention wherein the present invention is not limited to the configuration of this embodiment in respect of the bit number n or l of a corresponding digital video signal. The configuration of the embodiment is effective for the case that the digital video signal has bits of 3 or more.

Figure 12:
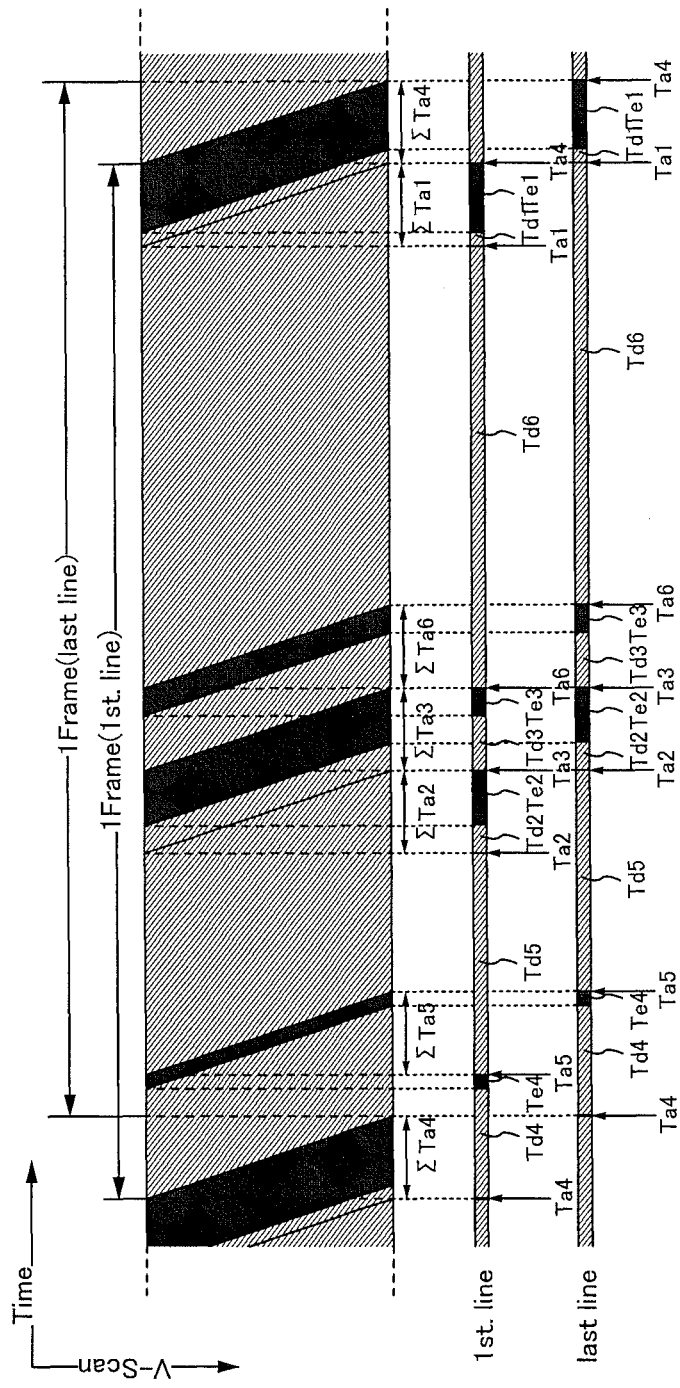
FIG. 12 is a chart showing the occurrence of a write period and display period in the digital driving method.

FIG. 12 shows the occurrence timing of a write period, a display period or a non-display period in the driving method in this embodiment. The horizontal axis represents a time while the vertical axis represents a position of the first scanning line and second scanning line possessed by the pixel. Note that, because the write period is short, the timing a write period Ta1-Ta6 corresponding to each bit commences is denoted at an arrow in order for easily seeing the figure. Meanwhile, the period (ΣTa1-ΣTa6) for each bit is shown at an arrow, which is of from a commencement of a write period to the pixel on the first line to a termination of a write period to the pixel on a y-th line.

The concrete operation on the pixel can be referred to Embodiment Mode 3 and hence is omittedly explained herein.

At first, a write period Ta4 commences on the pixel in the first line. When the write period Ta4 commences, a fourth-bit digital video signal is inputted to the pixel of the first line.

After the write period Ta4 terminates on the pixels of the first line, then a write period Ta4 commences sequentially on the pixels in the second line or the following. Similarly to the pixels of the first line, fourth-bit digital video signal is inputted to the pixels of each line.

On the other hand, concurrently with the commencement of a write period Ta4 on the pixel of the second line or the following, a display period Td4 commences on the pixel of the first line. When the display period Td4 commences, display is made by the pixels of the first line according to the fourth-bit digital video signal.

Then, after commencing the display period Td4 on the pixels of the first line, the write period Ta4 terminates sequentially on the pixels of the second line or the following thereby commencing a display time Td4. Display is made on the pixels of each line according to a fourth-bit digital video signal.

On the other hand, after a display time Td4 commences on the pixel of the second line or the following, the display period Td4 terminates on the pixels of the first line to commence a non-display period Te4. Incidentally, concurrently with the commencement of a display period Td4 on the pixels of the second line or the following, the display period Td4 may terminate on the pixels of the first line to commence a non-display period Te4.

By commencing a non-display period Te4, the pixels of the first line become not to make display.

Next, after a non-display period Te4 commences on the pixel of the first line, the display period Td4 terminates also on the pixel of the second line or the following to commence a non-display period Te4. Consequently, the pixels on each line become not to make display.

On the other hand, in concurrent with the commencement of a non-display period Te4 on the pixel of the second line or the following or after commencing a non-display period Te4 on all the pixels, a write period Ta5 commences on the pixel of the first line.

When a write period Ta5 commences on the pixel of the first line, a fifth-bit digital video signal is inputted to the pixels of the first line. When the write period Ta5 terminates on the pixels of the first line, a write period Ta5 commences sequentially on the pixels of the second line or the following.

On the other hand, after terminating the write period Ta5 on the pixels of the first line, a display period Td5 commences on the pixel of the first line concurrently with the commencement of a write period Ta5 on the pixel of the second line or the following. In the display period Td5, the pixels make display according to a fifth-bit digital video signal similarly to that in the display period Td5.

After a display period Td5 commences on the pixel of the first line, the write period Ta5 terminates sequentially on the pixels of the second line or the following to commence a display period Td5.

Next, after a display period Td5 has commenced on the pixel of all the lines, the display period Td5 terminates on the pixels of the first line to commence a write period Ta2.

When a write period Ta2 commences on the pixel of the first line, a second-bit digital video signal is inputted to the pixels of the first line.

When the write period Ta2 terminates on the pixels of the first line, a write period Ta2 commences sequentially on the pixels of the second line or the following. Similarly to the case of the pixels on the first line, a second-bit digital video signal is inputted to the pixels of each line.

On the other hand, concurrently with the commencement of a write period Ta2 on the pixel of the second line or the following, a display period Td2 commences on the pixel of the first line. When a display period Td2 commences, the pixels of the first line make display according to a second-bit digital video signal.

After commencing a display period Td2 on the pixels of the first line, the write period Ta2 terminates sequentially on the pixels of the second line or the following to commence a display period Td2. The pixels of each line make display according to a second-bit digital video signal.

On the other hand, concurrently with the commencement of a display time Td2 on the pixel of the second line or the following, the display period Td2 terminates on the pixels of the first line to commence a non-display period Te2.

By commencing a non-display period Te2, the pixels of first line become not to make display.

Next, after commencing a non-display period Te2 on the pixel of the first line, the display period Td2 terminates sequentially on the pixels of the second line or the following to commence a non-display period Te2. Consequently, the pixels of each line become not to display.

On the other hand, concurrently with the commencement of a non-display period Te2 on the pixel of the second line or the following or after having commenced a non-display period Te2 on all the pixels, a write period Ta3 commences on the pixel of the first line.

The above operation is repeated before all the first- to sixth-bit digital video signals have been inputted to the pixels, whereby a write period Ta, a display period Td and a non-display period Te occur repeatedly on a pixel-by-pixel basis of each line.

After terminating all the display periods Td1-Td6 on the pixels of the first line, one frame period completes on the pixels of the first line to again commence a first write period of the next frame period (T4 in this embodiment). Meanwhile, after one frame period completes on the pixels of the first line, one frame period completes also on the pixels of the second line or the following to again commence a write period Ta4 of the next frame period.

The foregoing operation is repeated again. The commencement and terminating timing of one frame period has a time difference on a pixel-by-pixel basis of each line.

By terminating one frame period on the pixels of all the lines, one image can be displayed.

In this embodiment, the display periods assumably has a length of $Td1:Td2: \ldots :Td5:Td6 = 2^0:2^1: \ldots :2^4:2^5$. The combination of the display periods allow for representation at a desired gray scale of among $2^6$ gray scales.

By determining a sum in length of the display period for which the OLED has emitted light within one frame period, fixed is a gray scale that the pixel has made display within the same frame period. For example, in the case of the present embodiment, provided that the brightness that the pixel emits light for the total display period is 100%, the light emission on the pixel for Td1 and Td2 can give a representation at a brightness of 5%. Where selecting Td3 and Td5, it is possible to give a representation at a brightness of 32%.

Incidentally, the write period does not overlap between the pixels on each line, after terminating the write period on the pixels of a y-th line, a write period is commenced on the pixel of the first line.

In this embodiment, it is essential that the display period Td5 on the pixels of each line is longer than the period ($\Sigma$Ta5) of from a commencement of a write period Ta5 on the pixel of the first line to a termination of a write period Ta5 on the pixels of the y-th line.

The display periods Td1-Td6 may occur in any of sequence. For example, it is possible for display periods to occur in the sequence of, next to Td1, Td3, Td5, Td2, ... within one frame period. However, the write periods must not be overlapped between the pixels on each line.

The driving method of the present invention can make the display period on the pixel of each line shorter than the duration of from a commencement of a write period Ta on the pixels of the first line to a termination of a write period on the pixel of the y-th line, in other words shorter than the duration to write 1-bit digital video signal to all the pixels: Accordingly, even where the digital video signal increases in bits, the display period corresponding to the lower bit can be made short. Thus, it is possible to display a precise image without causing flicker on the screen.

Meanwhile, the light-emitting device of the present invention can obtain a constant brightness without being affected by temperature change. Even where an OLED having EL materials different between colors is provided in color display, it is possible to prevent against the random variation in brightness on the OLEDs between the respective colors due to temperature, i.e. against the impossibility to obtain a desired color.

Note that, in the driving method of this embodiment, the longest display period within one frame period (Td6 in this embodiment) is not provided at the beginning or end of the one frame period. In other words, configuration is made such that, prior to or after the longest display period within one frame period, another display period included in the same frame period occurs.

The above configuration makes it possible for the human eye to less recognize the unevenness of display caused by the adjacent display periods to emit light at between the adjacent frame periods during display with a neutral gray scale.

The structure of this example can be combined freely with Embodiment 2.

Embodiment 6

This example gives a description on an embodiment of a driving method, which is different from the one described in Example 5, and uses n bit digital video signals. The case described in this embodiment is about when 1=n–2.

The driving method in this example has the display period Tdn and the display period Td(n+1) that are associated with the most significant bit digital video signal. The writing period Tan and the writing period Ta(n+1) are provided, which are associated with the display period Tdn and the display period Td(n+1) respectively.

In this embodiment, the display period Tdn and the display period Td(n+1) that are associated with same bit of the digital video signal do not appear in succession. In other wards, another display period is provided between the display period Tdn and Td(n+1) that are associated with same bit of the digital video signal.

Figure 13:
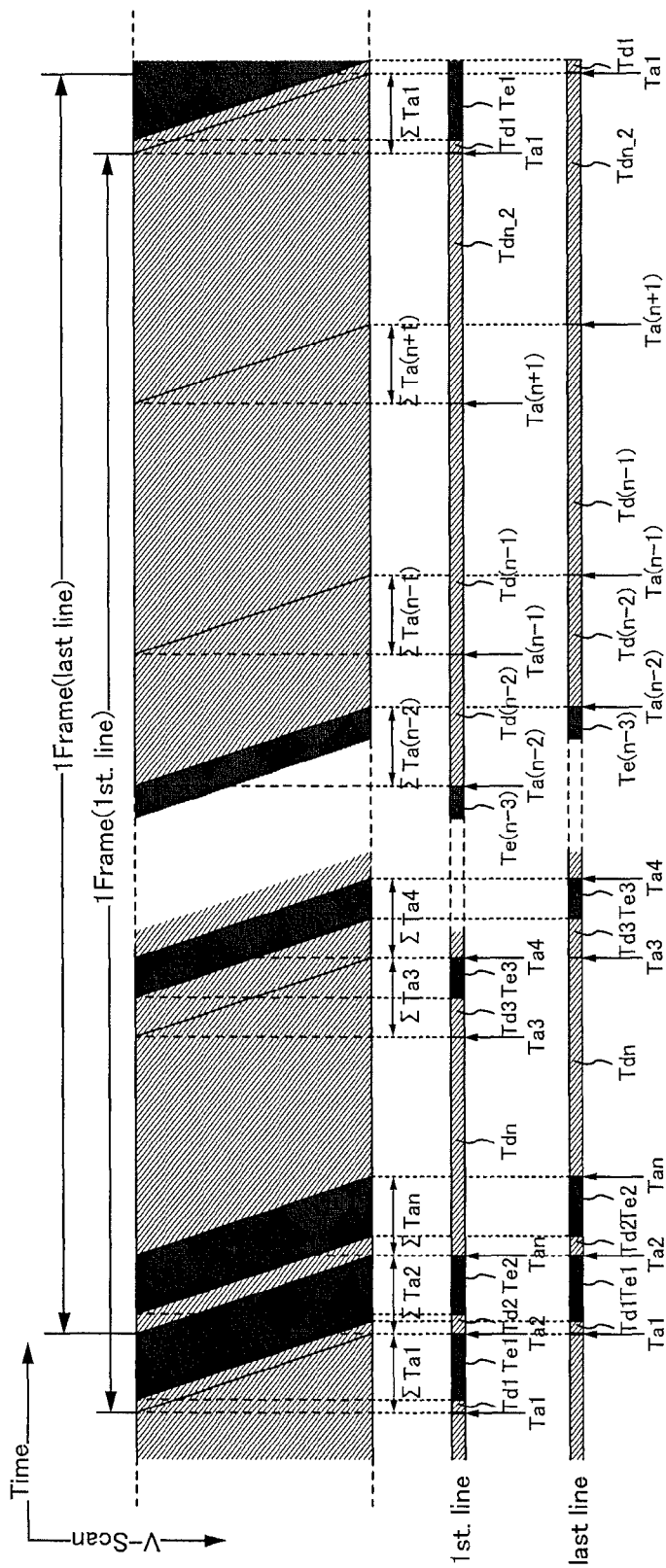
FIG. 13 is a chart showing the occurrence of a write period and display period in the digital driving method.

FIG. 13 is a timing diagram of writing periods, display periods, and non-display periods according to the driving method of this embodiment. The horizontal axis indicates time and the vertical axis indicates the position of the first scanning line and the second scanning line. The writing periods are not shown as bands in FIG. 13 because they are short. Instead, for less crowded view, arrows indicate starting points of the writing periods Ta1 to Ta(n+1). A period that begins with the start of a writing period in the pixels on first line and ends with the end of a writing period in the pixels on y-th line for a 1 bit digital video signal is denoted by Ta1 to ΣTa(n+1) and indicated by an arrow.

Details about how pixels operate are described in Embodiment Modes and the explanation is therefore omitted here.

The length of the display periods Td1 to Td(n+1) is set so as to satisfy Td1:Td2: . . . :Td(n−1):(Tdn+Td(n+1))=$2^0$: $2^1$: . . . :$2^{n-2}$:$2^{n-1}$.

The gradation display is obtained by controlling the total light emission time of a pixel in one frame period.

The above structure makes the uneven display in middle gradation display less recognizable to the human eye than in Embodiment 2. The uneven display is caused by adjoining display periods during which light is emitted from pixels in adjacent frame periods.

Described in this embodiment is the case in which two display periods are provided for the digital video signal of the same bit. However, the present invention is not limited thereto. Three or more display periods may be provided for the digital video signal of the same bit in one frame period.

Although a plurality of display periods are provided for the most significant bit digital video signal, the present invention is not limited thereto. A digital video signal of other bit than the most significant bit may have a plurality of display periods. There is no need to limit the number of digital video signal bits that can have a plurality of display periods to one. A digital video signal of certain bit and a digital video signal of another bit can respectively have plural display periods.

The structure of this embodiment is effective when n≥2. This example can be combined freely with Embodiments 2 or 5.

Embodiment 7

This embodiment gives a description on a method of manufacturing a light-emitting device according to the present invention. In this embodiment, a description uses the pixel manufacturing method in FIG. 2. Though the cross sectional diagram of transistors Tr2 and Tr4 of pixels are only shown in this embodiment, the transistors Tr1 and Tr3 can be formed referring to the manufacturing method of this embodiment. Another transistors of pixels (for example, the transistor Tr5 as for pixels shown in FIG. 9) can be formed by the same method. In addition, driving circuits (a signal line driving circuit, a first scanning line driving circuit, and a second scanning line driving circuit) provided in the periphery of the pixel portion may be formed on the same substrate on which the TFTs for the pixel portion are placed at the same time the pixel portion TFTs are formed.

First, as shown in FIG. 14A, a base film 302 is formed from an insulating film such as a silicon oxide film, a silicon nitride film, and a silicon oxynitride film on a glass substrate 301. The substrate 301 is formed of barium borosilicate glass typical example of which is Corning #7059 glass or Corning #1737 glass (product of Corning Incorporated), or of aluminoborosilicate glass. The base film 302 is, for example, a laminate of a silicon oxynitride film 302a that is formed from SiH$_4$, NH$_3$, and N$_2$O by plasma CVD to a thickness of 10 to 200 nm (preferably 50 to 100 nm) and a silicon oxynitride hydride film 302b formed from SiH$_4$ and N$_2$O by plasma CVD to a thickness of 50 to 200 nm (preferably 100 to 150 nm). Although the base film 302 in this example has a two-layer structure, it may be a single layer of one of the insulating films given in the above, or a laminate of two or more layers of those insulating films.

A semiconductor film having an amorphous structure is crystallized by laser crystallization or a known thermal crystallization method to form a crystalline semiconductor film. The crystalline semiconductor film makes island-like semiconductor layers 303 to 306. The island-like semiconductor layers 303 to 306 each have a thickness of 25 to 80 nm (preferably 30 to 60 nm). No limitation is put on the choice of material of the crystalline semiconductor film but it is preferable to use silicon or a silicon germanium (SiGe) alloy.

When the crystalline semiconductor film is formed by laser crystallization, a pulse oscillation type or continuous wave excimer laser, YAG laser, or YVO$_4$ laser is used. Laser light emitted from a laser as those given in the above is desirably collected into a linear beam by an optical system before irradiating the semiconductor film. Conditions of crystallization are set suitably by an operator. However, if an excimer laser is used, the pulse oscillation frequency is set to 300 Hz and the laser energy density is set to 100 to 400 mJ/cm$^2$ (typically 200 to 300 mJ/cm$^2$). If a YAG laser is used, second harmonic thereof is employed and the pulse oscillation frequency is set to 30 to 300 kHz while setting the laser energy density to 300 to 600 mJ/cm$^2$ (typically 350 to 500 mJ/cm$^2$). The laser light is collected into a linear beam having a width of 100 to 1000 μm, for example, 400 μm, to irradiate the entire substrate. The substrate is irradiated with the linear laser light with the beams overlapping each other at an overlap ratio of 50 to 90%.

Next, a gate insulating film 307 is formed so as to cover the island-like semiconductor layers 303 to 306. The gate insulating film 307 is formed from an insulating film containing silicon by plasma CVD or sputtering to a thickness of 40 to 150 nm. In this embodiment, a silicon oxynitride film having a thickness of 120 nm is used. Needless to say, the gate insulating film is not limited to a silicon oxynitride film but may be a single layer or a laminate of other insulating films containing silicon. For example, if a silicon oxide film is used for the gate insulating film, the film is formed by plasma CVD in which TEOS (tetraethyl orthosilicate) is mixed with O$_2$ and the reaction pressure is set to 40 Pa, the substrate temperature to 300 to 400° C., the frequency is set high to 13.56 MHz, and the power density is set to 0.5 to 0.8 W/cm$^2$ for electric discharge. The silicon oxide film thus formed can provide the gate insulating film with excellent characteristics when it is subjected to subsequent thermal annealing at 400 to 500° C.

On the gate insulating film 307, a first conductive film 308 and a second conductive film 309 for forming gate electrodes are formed. In this example, the first conductive film 308 is a Ta film with a thickness of 50 to 100 nm and the second conductive film 309 is a W film with a thickness of 100 to 300 nm.

The Ta film is formed by sputtering in which Ta as a target is sputtered with Ar. In this case, an appropriate amount of Xe or Kr is added to Ar to ease the internal stress of the Ta film and thus prevent the Ta film from peeling off. The resistivity of a Ta film in a phase is about 20 μΩcm and is usable for a gate electrode. On the other hand, the resistivity of a Ta film in β phase is about 180 μΩcm and is not suitable for a gate electrode. A Ta film in α phase can readily be obtained when a base with a thickness of about 10 to 50 nm is formed from tantalum nitride that has a crystal structure approximate to that of the a phase Ta film.

The W film is formed by sputtering with W as a target. Alternatively, the W film may be formed by thermal CVD using tungsten hexafluoride (WF$_6$). In either case, the W film has to have a low resistivity in order to use the W film as a gate electrode. A desirable resistivity of the W film is 20 μΩcm or lower. The resistivity of the W film can be reduced by increasing the crystal grain size but, if there are too many impurity elements such as oxygen in the W film, crystallization is inhibited to raise the resistivity. Accordingly, when the W film is formed by sputtering, a W target with a purity of 99.9999% or 99.99% is used and a great care is taken not to allow impurities in the air to mix in the W film being formed. As a result, the W film can have a resistivity of 9 to 20 μΩcm.

Although the first conductive film 308 is a Ta film and the second conductive film 309 is a W film in this example, there is no particular limitation. The conductive films may be formed of any element selected from the group consisting of Ta, W, Ti, Mo, Al, and Cu, or of an alloy material or compound material mainly containing the elements listed above. A semiconductor film, typically a polycrystalline silicon film doped with an impurity element such as phosphorus, may be used instead. Other desirable combinations of materials for the first and second conductive films than the one shown in this embodiment includes: tantalum nitride (TaN) for the first conductive film 308 and W for the second conductive film 309; tantalum nitride (TaN) for the first conductive film 308 and Al for the second conductive film 309; and tantalum nitride (TaN) for the first conductive film 308 and Cu for the second conductive film 309. (FIG. 14A)

Next, a resist mask 310 is formed to carry out first etching treatment for forming electrodes and wiring lines. In this embodiment, ICP (inductively coupled plasma) etching is employed in which CF$_4$ and Cl$_2$ are mixed as etching gas and an RF (13.56 MHz) power of 500 W is given to a coiled electrode at a pressure of 1 Pa to generate plasma. The substrate side (sample stage) also receives an RF (13.56 MHz) power of 100 W so that a substantially negative self-bias voltage is applied. When the mixture of CF$_4$ and Cl$_2$ is used, the W film and the Ta film are etched to the same degree.

Under the above etching conditions, if the resist mask is properly shape, the first conductive film and the second conductive film are tapered around the edges by the effect of the bias voltage applied to the substrate side. The angle of the tapered portions is 15 to 45°. In order to etch the conductive films without leaving any residue on the gate insulating film, the etching time is prolonged by about 10 to 20%. The selective ratio of the W film to the silicon oxynitride film is 2 to 4 (typically 3), and therefore a region where the silicon oxynitride film is exposed is etched by about 20 to 50 nm by the over-etching treatment. In this way, first shape conductive layers 311 to 315 (first conductive layers 311a to 315a and second conductive layers 311b to 315b) are formed from the first conductive film and the second conductive film through the first etching treatment. At this point, regions of the gate insulating film 307 that are not covered with the first shape conductive layers 311 to 315 are etched and thinned by about 20 to 50 nm. Further, the mask 310 is also etched by the above etching treatment.

First doping treatment is conducted next for doping of an impurity element that gives the n-type conductivity. Ion doping or ion implanting is employed. In ion doping, the dose is set to $1 \times 10^{13}$ to $5 \times 10^{14}$ atoms/cm$^2$ and the acceleration voltage is set to 60 to 100 keV. The impurity element that gives the n-type conductivity is an element belonging to Group 15, typically, phosphorus (P) or arsenic (As). Here, phosphorus (P) is used. In this case, the conductive layers 311 to 314 serve as masks against the impurity element, that gives the n-type conductivity, and first impurity regions 317 to 320 are formed in a self-aligning manner. The first impurity regions 317 to 320 each contain the impurity element that gives the n-type conductivity in a concentration of $1 \times 10^{20}$ to $1 \times 10^{21}$ atoms/cm$^3$. (FIG. 14B)

Next, second etching treatment is conducted while leaving the resist mask 310 in place as shown in FIG. 14C. CF$_4$, Cl$_2$, and O$_2$ are used as etching gas to etch the W film selectively. Through the second etching treatment, second shape conductive layers 325 to 329 (first conductive layers 325a to 329a and second conductive layers 325b to 329b) are formed. At this point, regions of the gate insulating film 307 that are not covered with the second shape conductive layers 325 to 329 are further etched and thinned by about 20 to 50 nm.

The reaction of the W film and the Ta film to etching by the mixture gas of CF$_4$ and Cl$_2$ can be deduced from the vapor pressure of radical or ion species generated and of reaction products. Comparing the vapor pressure among fluorides and chlorides of W and Ta, WF$_6$ that is a fluoride of W has an extremely high vapor pressure while the others, namely, $WCl_5$, $TaF_5$, and $TaCl_5$ have a vapor pressure of about the same degree. Accordingly, the W film and the Ta film are both etched with the mixture gas of $CF_4$ and $Cl_2$. However, when an appropriate amount of $O_2$ is added to this mixture gas, $CF_4$ and $O_2$ react to each other to be changed into CO and F, generating a large amount of F radicals or F ions. As a result, the W film whose fluoride has a high vapor pressure is etched at an increased etching rate. On the other hand, the etching rate of the Ta film is not increased much when F ions are increased in number. Since Ta is more easily oxidized than W, the addition of $O_2$ results in oxidization of the surface of the Ta film. The oxide of Ta does not react with fluorine or chlorine and therefore the etching rate of the Ta film is reduced further. Thus, a difference in etching rate is introduced between the W film and the Ta film, so that the etching rate of the W film is set faster than the etching rate of the Ta film.

Figure 15A:
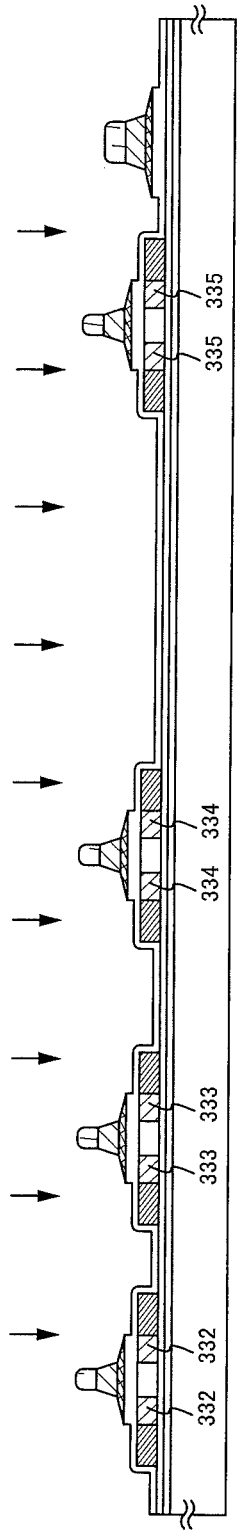
FIG. 15A to 15C are views showing the fabrication method of a light-emitting device of the present invention.

Then second doping treatment is conducted as shown in FIG. 15A. In the second doping treatment, the film is doped with an impurity element that gives the n-type conductivity in a dose smaller than in the first doping treatment and at a high acceleration voltage. For example, the acceleration voltage is set to 70 to 120 keV and the dose is set to $1 \times 10^{13}$ atoms/cm$^2$ to form new impurity regions inside the first impurity regions that are formed in the island-like semiconductor layers in FIG. 14B. While the second shape conductive layers 325 to 328 are used as masks against the impurity element, regions under the first conductive layers 325a to 328a are also doped with the impurity element. Thus formed are third impurity regions 332 to 335. The third impurity regions 332 to 335 contain phosphorus (P) with a gentle concentration gradient that conforms with the thickness gradient in the tapered portions of the first conductive layers 325a to 328a. In the semiconductor layers that overlap the tapered portions of the first conductive layers 325a to 328a, the impurity concentration is slightly lower around the center than at the edges of the tapered portions of the first conductive layers 325a to 328a. However, the difference is very slight and almost the same impurity concentration is kept throughout the semiconductor layers.

Figure 15B:
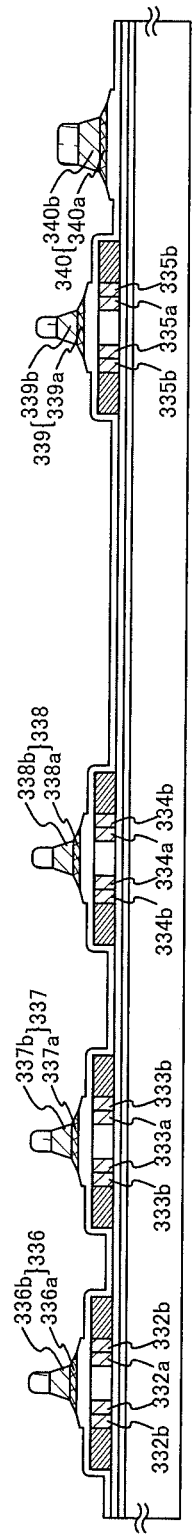

Third etching treatment is then carried out as shown in FIG. 15B. $CHF_6$ is used as etching gas, and reactive ion etching (RIE) is employed. Through the third etching treatment, the tapered portions of the first conductive layers 325a to 329a are partially etched to reduce the regions where the first conductive layers overlap the semiconductor layers. Thus formed are third shape conductive layers 336 to 340 (first conductive layers 336a to 340a and second conductive layers 336b to 340b). At this point, regions of the gate insulating film 307 that are not covered with the third shape conductive layers 336 to 340 are further etched and thinned by about 20 to 50 nm.

Third impurity regions 332 to 335 are formed through the third etching treatment. The third impurity regions 332 to 335 consist of third impurity regions 332a to 335a that overlap the first conductive layers 336a to 339a, respectively, and second impurity regions 332b to 335b each formed between a first impurity region and a third impurity region.

Figure 15C:
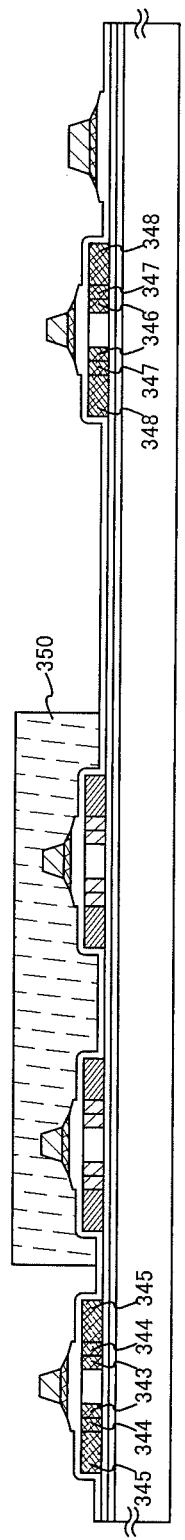

As shown in FIG. 15C, fourth impurity regions 343 to 348 having the opposite conductivity type to the first conductivity type are formed in the island-like semiconductor layers 303 and 306 for forming p-channel TFTs. The third shape conductive layers 336b and 339b are used as masks against the impurity element and impurity regions are formed in a self-aligning manner. At this point, the island-like semiconductor layers 304 and 305 for forming n-channel TFTs and third shape conductive layer 340 are entirely covered with a resist mask 350. The impurity regions 343 to 348 have already been doped with phosphorus in different concentrations. The impurity regions 343 to 348 are doped with diborane ($B_2H_6$) through ion doping such that diborane dominates phosphorus in each region and each region contain the impurity element in a concentration of $2 \times 10^{20}$ to $2 \times 10^{21}$ atoms/cm$^3$.

Through the steps above, the impurity regions are formed in the respective island-like semiconductor layers. The third shape conductive layers 336 to 339 overlapping the island-like semiconductor layers function as gate electrodes. The third conductive layers 340 function as gate wiring lines.

After the resist mask 350 is removed, the impurity elements used to dope the island-like semiconductor layers in order to control the conductivity types are activated. The activation step is carried out by thermal annealing using an annealing furnace. Other activation methods adoptable include laser annealing and rapid thermal annealing (RTA). The thermal annealing is conducted in a nitrogen atmosphere with an oxygen concentration of 1 ppm or less, preferably 0.1 ppm or less, at 400 to 700° C., typically 500 to 600° C. In this example, the substrate is subjected to heat treatment at 500° C. for four, hours. However, if the wiring line material used for the third shape conductive layers 336 to 340 are weak against heat, the activation is desirably made after an inter-layer insulating film (mainly containing silicon) is formed in order to protect the wiring lines and others. The third shape conductive layer 340 is a gate wiring line, and a part of which functions as gate electrode of the transistor Tr1 (not illustrated). In addition, the gate wiring line is connected to source region or drain region of the transistor Tr3 (not illustrated).

Another heat treatment is conducted in an atmosphere containing 3 to 100% hydrogen at 300 to 450° C. for one to twelve hours, thereby hydrogenating the island-like semiconductor layers. The hydrogenation steps are to terminate dangling bonds in the semiconductor layers using thermally excited hydrogen. Alternatively, plasma hydrogenation (using hydrogen that is excited by plasma) may be employed.

As shown in FIG. 16A, a first interlayer insulating film 355 is formed next from a silicon oxynitride film with a thickness of 100 to 200 nm. A second interlayer insulating film 356 is formed thereon from an organic insulating material. Thereafter, contact holes are formed through the first interlayer insulating film 355, the second interlayer insulating film 356, and the gate insulating film 307. Connection wiring lines 357 to 363 are formed by patterning. Reference symbol 363 denotes a power source line and a symbol 360 denotes a signal line.

The second interlayer insulating film 356 is a film made of an organic resin. Examples of the usable organic resin include polyimide, polyamide, acrylic resin, and BCB (benzocyclobutene). Since planarization is a significant aspect of the role of the second interlayer insulating film 356, acrylic resin that can level the surface well is particularly preferable. In this embodiment, the acrylic film is thick enough to eliminate the level differences caused by the TFTs. An appropriate thickness of the film is 1 to 5 μm (preferably 2 to 4 μm).

The contact holes are formed by dry etching or wet etching, and include contact holes reaching the impurity regions 317 to 319 having the n-type conductivity or the impurity regions 345 and 348 having the p-type conductivity, contact holes reaching the gate wiring lines 340, contact holes (not shown) reaching the power supply lines, and contact holes (not shown) reaching the gate electrodes.

The connection wiring lines 357 to 363 are obtained by patterning a laminate with a three-layer structure into a desired shape. The laminate consists of a Ti film with a thickness of 100 nm, a Ti-containing aluminum film with a thickness of 300 nm, and a Ti film with a thickness of 150 nm which are successively formed by sputtering. Other conductive films may of course be used.

The pixel electrode 365 in contact with the connecting wiring (drain wiring) 362 is formed by patterning. The connecting wiring comprises the source wiring and the drain wiring. The source wiring designates a wiring connected to the source region of the active layer, and the drain wiring designates a wiring connected to the drain region.

The pixel electrode 365 in this example is obtained by patterning an ITO film with a thickness of 110 nm. A contact is made by arranging the pixel electrode 365 so as to touch the connection wiring line 362. The pixel electrode may instead be formed of a transparent conductive film in which indium oxide is mixed with 2 to 20% zinc oxide (ZnO). The pixel electrode 365 serves as an anode of an OLED. (FIG. 16A)

Next, as shown in FIG. 16B, an insulating film containing silicon (a silicon oxide film, in this embodiment) is formed to a thickness of 500 nm and an aperture is opened in the film at a position corresponding to the position of the pixel electrode 365. A third interlayer insulating film 366 functioning as a bank is thus formed. The aperture is formed using wet etching, thereby readily forming tapered side walls. If the side wall of the aperture is not smooth enough, the level difference can make degradation of an organic light-emitting layer into a serious problem. Therefore attention must be paid.

An organic light-emitting layer 367 and a cathode (MgAg electrode) 368 are formed by vacuum evaporation successively without exposing the substrate to the air. The thickness of the organic light-emitting layer 367 is set to 80 to 200 nm (typically 100 to 120 nm). The thickness of the cathode 368 is set to 180 to 300 nm (typically 200 to 250 nm).

In this step, the organic light-emitting layer and the cathode are, formed, in a pixel for red light, then in a pixel for green light, and then in a pixel for blue light. The organic light-emitting layers have low resistivity to solutions, inhibiting the use of photolithography. Therefore, an organic light-emitting layer of one color cannot be formed together with an organic light-emitting layer of another color. Then organic light-emitting layers and cathodes are selectively formed in pixels of one color while covering pixels of the other two colors with a metal mask.

To elaborate, first, a mask that covers all the pixels except pixels for red light is set and the organic light-emitting layers for emitting red light are selectively formed using the mask. Then a mask that covers all the pixels except pixels for green light is set and the organic light-emitting layers for emitting green light are selectively formed using the mask. Lastly, a mask that covers all the pixels except pixels for blue light is set and the organic light-emitting layers for emitting blue light are selectively formed using the mask. Although different masks are used in the description here, the same mask may be used three times for forming the organic light-emitting layers of three colors.

Formed here are three types of OLED in accordance with R, G, and B. Instead, a white light-emitting OLED combined with color filters, a blue light or bluish green light-emitting element combined with fluorophors (fluorescent color conversion layers: CCM), or overlapped RGB OLED with a cathode (opposite electrode) formed of a transparent electrode may be used.

A known material can be used for the organic light-emitting layer 367. A preferable known material is an organic material, considering the driving voltage. For example, the organic light-emitting layer has a four-layer structure consisting of a hole injection layer, a hole transporting layer, a light-emitting layer, and an electron injection layer.

The cathode 368 is formed next. This example uses MgAg for the cathode 368 but it is not limited thereto. Other known materials may be used for the cathode 368.

The overlapping portion, which is comprised the pixel electrode 365, the organic light-emitting layer 367 and the cathode 368, corresponds to OLED 375.

Next, the protective electrode 369 is formed by an evaporation method. The protective electrode 369 may be formed in succession forming the cathode 368 without exposing the device to the air. The protective electrode 369 has an effect on protect the organic light-emitting layer 367 from moisture and oxygen.

The protective electrode 369 also prevents degradation of the cathode 368. A typical material of the protective electrode is a metal film mainly containing aluminum. Other material may of course be used. Since the organic light-emitting layer 367 and the cathode 368 are extremely weak against moisture, the organic light-emitting layer 367, the cathode 368, and the protective electrode 369 are desirably formed in succession without exposing them to the air. It is preferable to protect the organic light-emitting layer from the outside air.

Lastly, a passivation film 370 is formed from a silicon nitride film with a thickness of 300 nm. The passivation film 370 protects the organic compound layer 367 from moisture and the like, thereby further enhancing the reliability of the OLED. However, the passivation film 370 may not necessarily be formed.

A light-emitting device structured as shown in FIG. 16B is thus completed. Reference symbol 371 denotes p-channel TFT of the driving circuit, 372, n-channel TFT of driving circuit, 373, the transistor Tr4, and 374, the transistor Tr2.

The light-emitting device of this example exhibits very high reliability and improved operation characteristics owing to placing optimally structured TFTs in not only the pixel portion but also in the driving circuits. In the crystallization step, the film may be doped with a metal catalyst such as Ni to enhance the crystallinity. By enhancing the crystallinity, the drive frequency of the signal line driving circuit can be set to 10 MHz or higher.

In practice, the device reaching the state of FIG. 16B is packaged (enclosed) using a protective film that is highly airtight and allows little gas to transmit (such as a laminate film and a UV-curable resin film) or a light-transmissive seal, so as to further avoid exposure to the outside air. A space inside the seal may be set to an inert atmosphere or a hygroscopic substance (barium oxide, for example) may be placed there to improve the reliability of the OLED.

After securing the airtightness through packaging or other processing, a connector is attached for connecting an external signal terminal with a terminal led out from the elements or circuits formed on the substrate.

By following the process shown in this embodiment, the number of photo masks needed in manufacturing a light-emitting device can be reduced. As a result, the process is cut short to reduce the manufacture cost and improve the yield.

The structure of this example can be combined freely with Embodiment 1 through 6.

Embodiment 8

Figure 17:
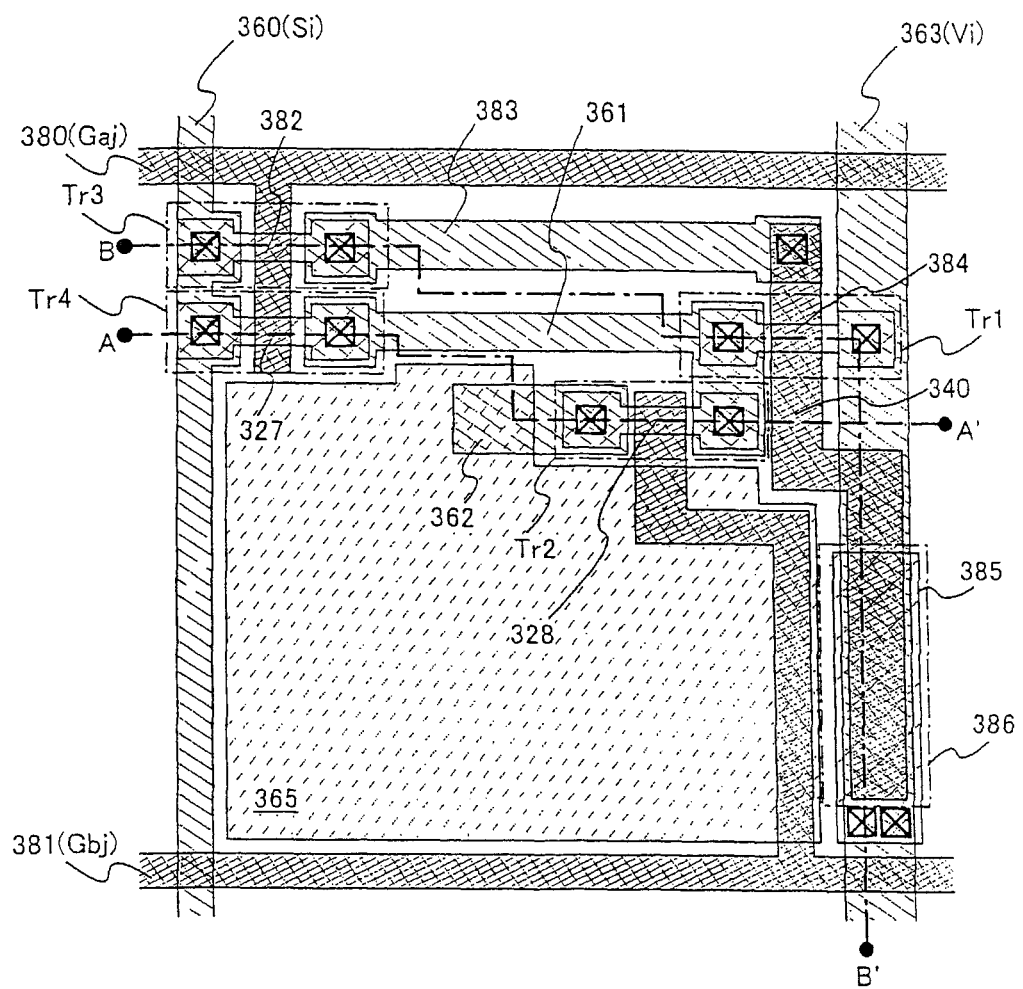
FIG. 17 is a top view of the pixel of the light-emitting device of the present invention.

This embodiment explains, in a top view, a pixel as formed in Embodiment 2. FIG. 17 shows a top view of a pixel of this embodiment. Note that FIG. 17 corresponds to a top view of a pixel of upon completing the process of FIG. 16A. In FIG. 17, various insulation films, such as interlayer insulation films and gate insulation films, are omitted in order to clarify the position of wirings and semiconductor layers. The wiring formed in the same layer is shown with the same hatching.

Figure 18:
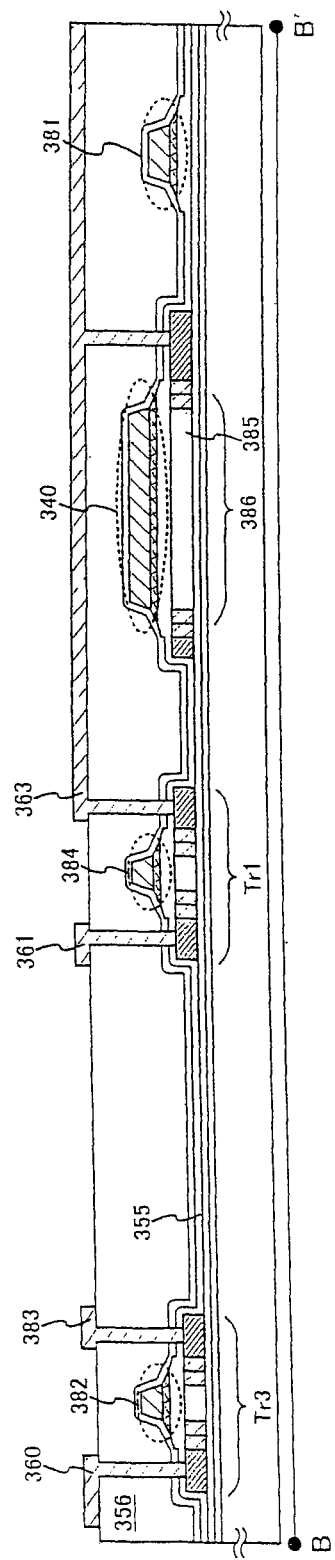
FIG. 18 is a sectional view of the pixel of the light-emitting device of the present invention.

The sectional view taken on a broken line A-A' in FIG. 17 corresponds to a part A-A' in FIG. 16A. FIG. 18 shows a sectional view taken on a broken line B-B' in FIG. 17.

The pixel shown in FIG. 17 has a wiring 360 (Si) serving as a signal line, a first scanning line 380 (Gaj), a second scanning line 381 (Gbj) and a power line 363 (Vj), each one in the number. The first scanning line 380 has portions 382, 327 respectively corresponding to the gate electrodes of the transistors Tr3 and Tr4.

One of the source and drain regions of the transistor Tr3 is connected to the signal line 360 while the other is connected to a gate wiring 340 through a wiring 383. The gate wiring 340 has a portion 384 serving as a gate electrode of the transistor Tr1.

Meanwhile, one of the source and drain regions of the transistor Tr4 is connected to the signal line 360 while the other is connected to the drain region of the transistor Tr1 and to the source region of the transistor Tr2 through a wiring 361.

The source region of the transistor Tr1 is connected to the power line 363. The drain region of the transistor Tr2 is connected to a pixel electrode 365 through a wiring 362.

The second scanning line 381 has a portion 328 serving as a gate electrode of the transistor Tr2.

The power line 363 overlaps with the gate wiring 340 through a sandwiched first and second interlayer film. The gate wiring 340 overlaps with a capacitance wiring 385 formed by a semiconductor film added with an impurity, through a sandwiched gate insulation film (not shown). The power line 363 and the capacitance wiring 385 are connected together through a contact hole. Note that the region, where the gate wiring 340 overlaps with the capacitance wiring 385 through a sandwiched gate insulation film, corresponds to a storage capacitor 386. Furthermore, the region, where the power line 363 overlaps with the gate wiring 340 through the sandwiched first and second interlayer film, may be used as a storage capacitor.

By forming the power line 363 at beneath a partition wall (bank) demarcating between the pixels, the storage capacitor and power line can be formed without reducing the opening ratio.

The pixel top view shown in this embodiment is a mere one structural example of the present invention. The pixel shown in the top view of FIG. 17 is not limited to the structure shown in this embodiment. Note that this example can be carried out in free combination with Embodiment 1-7.

Embodiment 9

Figure 19:
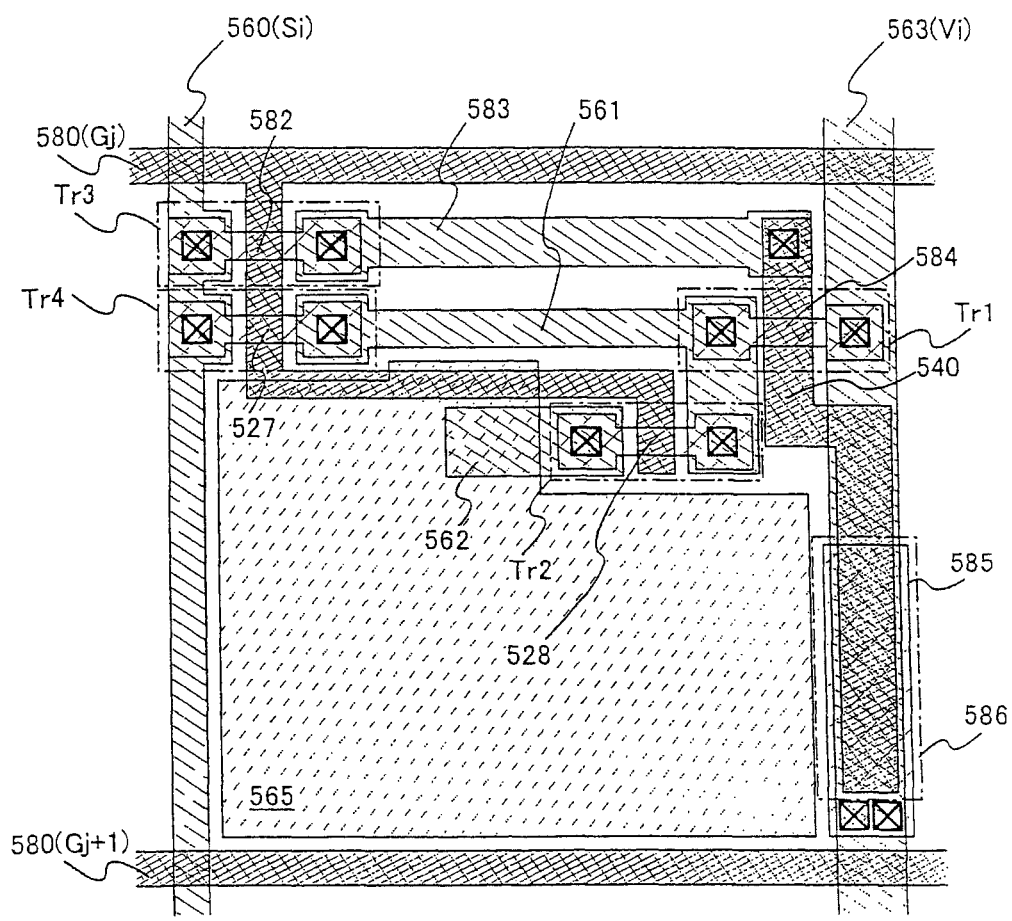
FIG. 19 is a top view of the pixel of the light-emitting device of the present invention.

This embodiment explains, in a top view, the pixel shown in FIG. 8. FIG. 19 shows a top view of a pixel in the present embodiment. Note that FIG. 17 corresponds to a top view of a pixel in a stage of after forming a pixel electrode but before depositing an organic light-emitting layer. In FIG. 19, various insulation films including interlayer and gate insulation films are omitted in order to clarify the position of a wiring and semiconductor layer. The wiring formed in the same layer is shown with hatching.

The pixel shown in FIG. 19 has a wiring 560 (Si) serving as a signal line, a scanning line 580 (Gj) and a power line 563 (Vi), one each in the number. The scanning line 580 has portions 582, 527, 528 respectively corresponding to the gate electrodes of the transistors Tr3, Tr4 and Tr2.

One of the source and drain regions of the transistor Tr3 is connected to the signal line 560 while the other is connected to a gate wiring 540 through a wiring 583. The gate wiring 540 has a portion 584 serving as a gate electrode of the transistor Tr1.

Meanwhile, one of the source and drain regions of the transistor Tr4 is connected to the signal line 560 while the other is connected to the drain region of the transistor Tr1 and to the source region of the transistor Tr2 through a wiring 561.

The source region of the transistor Tr1 is connected to the power line 563. The drain region of the transistor. Tr2 is connected to a pixel electrode 565 through a wiring 562.

The power line 563 overlaps with the gate wiring 540 through a sandwiched first and second interlayer film. The gate wiring 540 overlaps with a capacitance wiring 585 formed by a semiconductor film added with an impurity, through a sandwiched gate insulation film (not shown). The power line 563 and the capacitance wiring 585 are connected together through a contact hole. Note that the region, where the gate wiring 540 overlaps with the capacitance wiring 585 through a sandwiched gate insulation film, corresponds to a storage capacitor 586. Furthermore, the region, where the power line 563 overlaps with the gate wiring 540 through the sandwiched first and second interlayer film, may be used as a storage capacitor.

By forming the power line 563 at beneath a partition wall (bank) demarcating between the pixels, the storage capacitor and power line can be formed without reducing the opening ratio.

The pixel shown in the top view of this embodiment is a mere one structural example of the present invention. The pixel shown in the top view of FIG. 19 is not limited to the structure shown in the present embodiment. Note that this embodiment can be carried out in free combination with Embodiment 1-7.

Embodiment 10

This embodiment describes structures of driving circuits (a signal line driving circuit and a first scanning line driving circuit) in a light-emitting device of the present invention which is driven by using a digital video signal.

Figure 20:
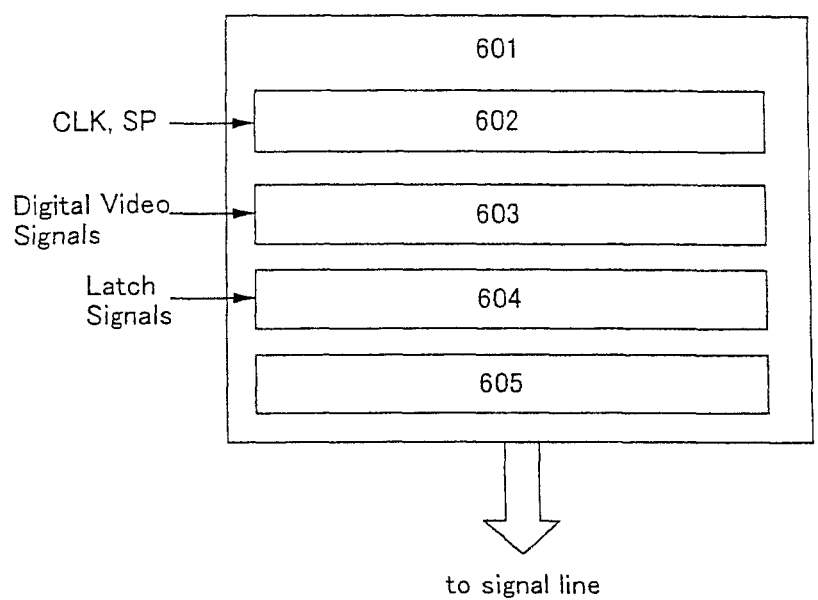
FIG. 20 is a block diagram of a signal line drive circuit.

FIG. 20 is a block diagram showing the structure of a signal line driving circuit 601. Reference symbol 602 denotes a shift register, 603, a memory circuit A, 604, a memory circuit B, and 605, a constant current circuit.

Clock signals CLK and start pulse signals SP are inputted to the shift register 602. Digital video signals are inputted to the memory circuit A 603 and latch signals are inputted to the memory circuit B 604. The constant current circuit 605 outputs a constant signal current Ic, which is inputted to signal lines.

Figure 21:
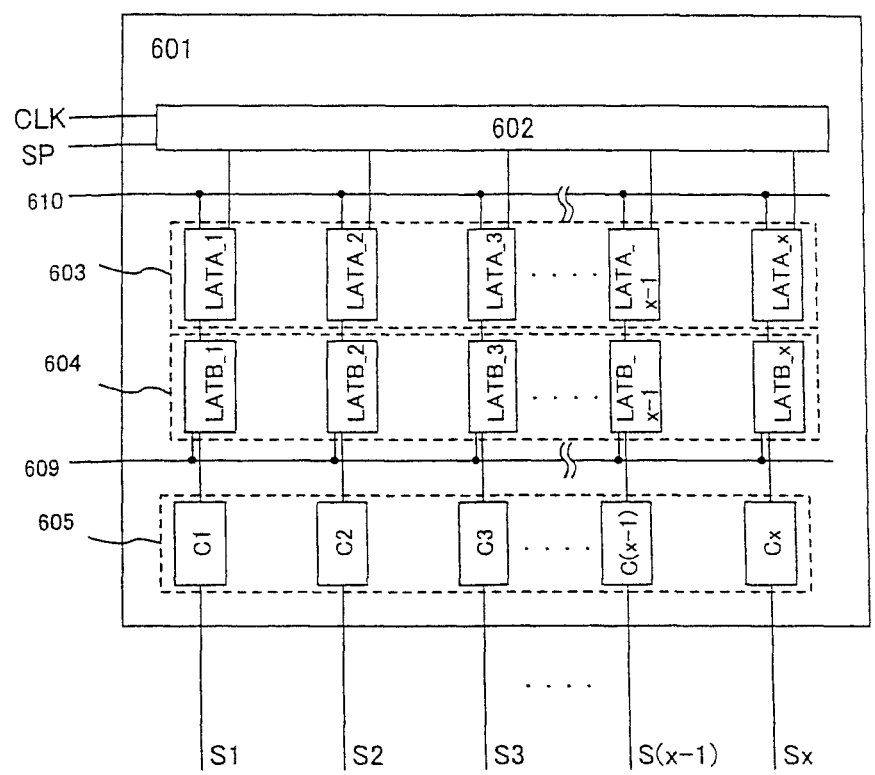
FIG. 21 is a detailed diagram of the signal line drive circuit in the digital driving method.

FIG. 21 shows a more detailed structure of the signal line driving circuit 601.

The shift register 602 generates timing signals in response to clock signals CLK and start pulse signals SP inputted from given wiring lines. The timing signals are respectively inputted to a plurality of latches A (LATA_1 to LATA_x) of the memory circuit A 603. The timing signals generated in the shift register 602 may be buffered and amplified by a buffer or the like before inputting the signals to the plural latches A (LATA_1 to LATA_x) of the memory circuit A 603.

When timing signals are inputted to the memory circuit A 603, in sync with the timing signals, digital video signals equivalent to one bit which are inputted to a video signal line 510 are sequentially written in the plural latches A (LATA_1 to LATA_x) to be stored therein.

In this embodiment, digital video signals are sequentially inputted to the plural latches A (LATA_1 to LATA_x) of the memory circuit A 603 when inputting digital video signals into the memory circuit A 603. However, the present invention is not limited thereto. The present invention may employ a so-called division driving in which the plural stages of lathes of the memory circuit A 603 are divided into a few groups and digital video signals are inputted to the respective groups simultaneously. The number of groups in division driving is referred to as number of division. For example, if four stages of latches make one group, then it is four divisions driving.

The time required for completing writing digital video signals once into all stages of latches of the memory circuit A 603 is called a line period. In practice, sometimes the line period defined as above plus a horizontal retrace period is regarded as a line period.

Upon completion of one line period, latch signals are supplied to a plurality of latches B (LATB_1 to LATB_x) of the memory circuit B 604 through a latch signal line 609. At this instant, the digital video signals that have been held in the plural latches A (LATA_1 to LATA_x) of the memory circuit A 603 are sent to the plural latches B (LATB_1 to LATB_x) of the memory circuit B 604 all at once to be written and held therein.

Having sent the digital video signals to the memory circuit B 604, the memory circuit A 603 now receives the next supply of digital video signals equivalent to one bit so that the digital video signals are sequentially written in response to timing signals from the shift register 602.

After one line period is thus started for the second time, the digital video signals written and held in the memory circuit B 604 are inputted to the constant current circuit 605.

The constant current circuit 605 has a plurality of current setting circuits (C1 to Cx). When digital video signals are respectively inputted to the current setting circuits (C1 to Cx), information of '0' or '1' contained in the digital video signals determines whether a constant current Ic flows in the signal line or the signal line receives the electric potential of power supply lines V1 to Vx.

Figure 22:
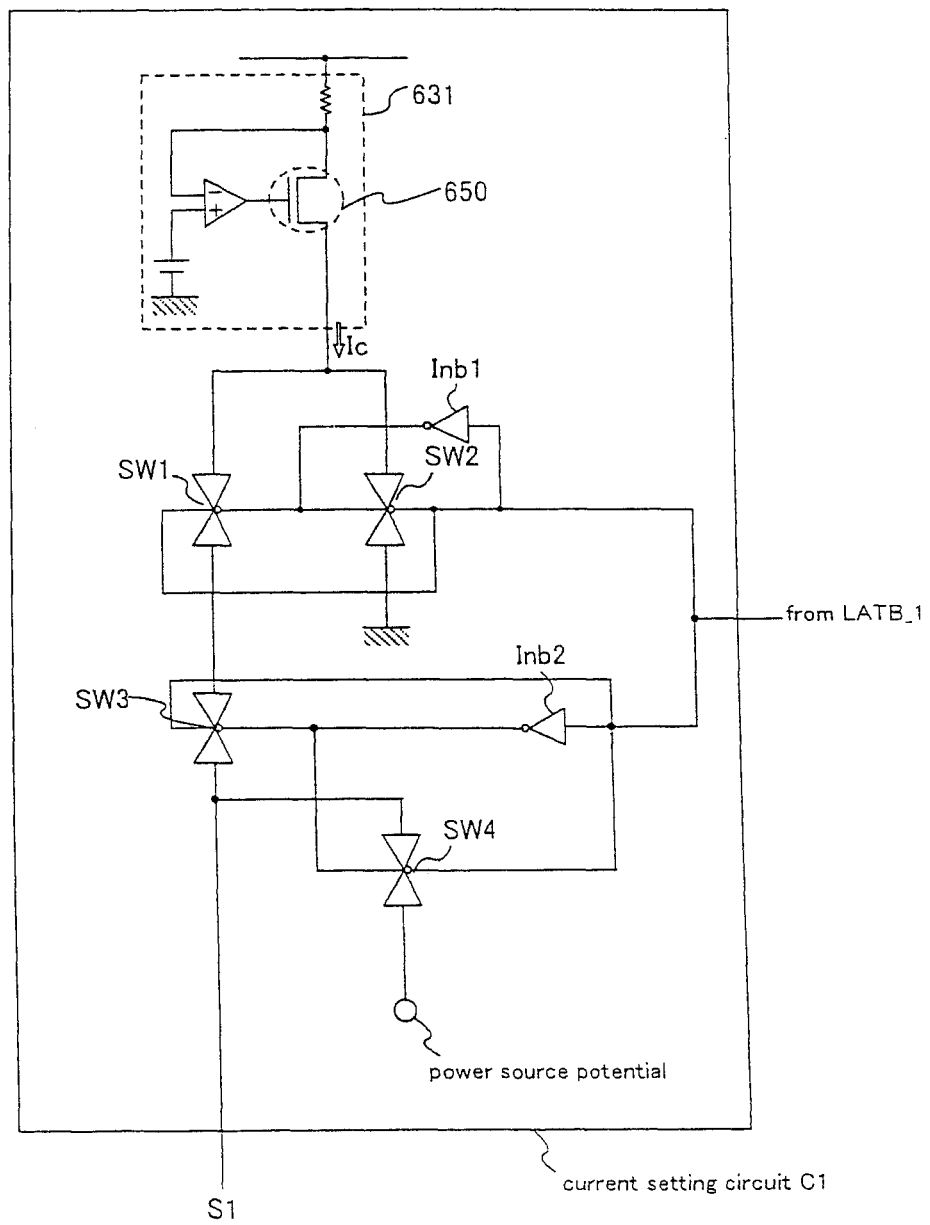
FIG. 22 is a circuit diagram of a current setting circuit in the digital driving method.

FIG. 22 shows an example of the specific structure for the current setting circuit C1. This structure is shared by the current setting circuits C2 to Cx.

The current setting circuit C1 has a constant current source 631, four transmission gates SW1 to SW4, and two inverters Inb1 and Inb2. A transistor 650 of the constant current source 631 has the same polarity as those of transistors Tr1 and Tr2 of each pixel.

Digital video signals outputted from the LATB_1 of the memory circuit B 604 are used to control switching of SW1 to SW4. Digital video signals inputted to SW1, SW3 are inverted by Inb1 and Inb2, and the inverted digital video signals are inputted to SW2 and SW4. Accordingly, SW2 and SW4 are OFF when SW1 and SW3 are ON and, when SW1 and SW3 are OFF, SW2 and SW4 are ON.

When SW1 and SW3 are ON, the current Ic having a given value other than 0 is inputted from the constant current source 631 to a signal line S1 through SW1 and SW3.

On the other hand, when SW2 and SW4 are ON, the current Ic from the constant current source 631 is dropped to the ground through SW2 and the power supply electric potential of the power supply lines V1 to Vx is given to the signal line S1 to set Ic nearly equal to 0 through SW4.

Back to FIG. 21, the operation described above is simultaneously conducted in all of the current setting circuits (C1 to Cx) of the constant current circuit 605 in one line period. Therefore, the value of the signal current Ic to be inputted is determined for the respective signal lines by digital video signals.

The structure of the first scanning line driving circuit is described next.

Figure 23:
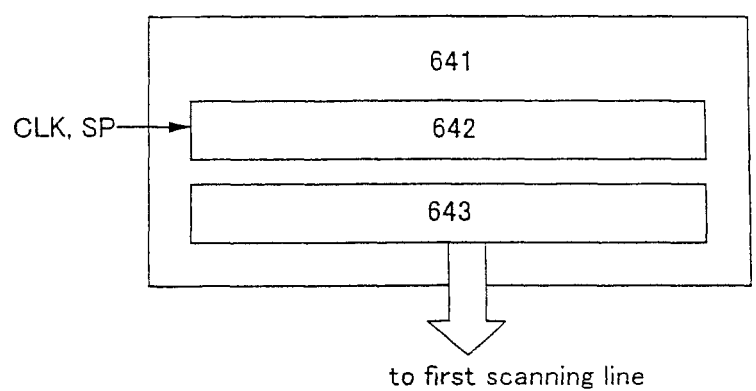
FIG. 23 is a block diagram of a first scanning line drive circuit.

FIG. 23 is a block diagram showing the structure of a first scanning line driving circuit 641.

The first scanning line driving circuit 641 has a shift register 642 and a buffer 643. In some cases, the first scanning line driving circuit may have a level shifter.

In the first scanning line driving circuit 641, timing signals are generated upon input of clock signals CLK and start pulse signals SP to the shift register 642. The timing signals generated are buffered and amplified by the buffer 643 and then the signals are supplied to associate scanning lines.

One scanning line is connected to gate electrodes of first switching transistors and second switching transistors of one line of pixels. Since the first switching transistors and second switching transistors of one line of pixels have to be turned ON all at once, the buffer 643 used is capable of causing a large amount of current to flow.

Structures of the driving circuits used in the present invention are not limited to those shown in this embodiment. The structure of the constant current circuit of this example is not limited to the one illustrated in FIG. 22. The constant current circuit used in the present invention can have any structure as long as it can cause the signal current Ic whose value is chosen from two values by a digital video signal to flow into a signal line.

Further, the second scanning driving circuit may have a same structure as that of the first scanning driving circuit.

The structure of this embodiment can be combined freely with Embodiments 1 through 9.

Embodiment 11

Figure 24A:
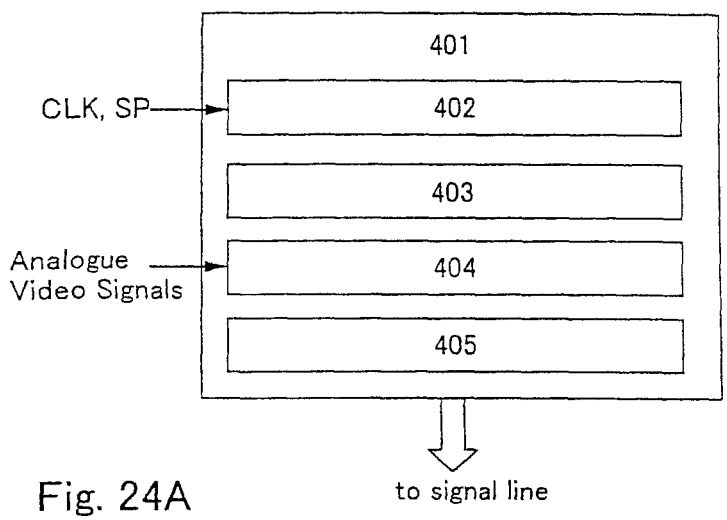
FIGS. 24A and 24B are detailed diagrams of the signal line drive circuit in the digital driving method.

This embodiment explains a configuration of a signal line drive circuit possessed by the light-emitting device of the present invention to be driven with analog video signals. Note that the configuration of a scanning line drive circuit can use the configuration shown in FIG. 23 and hence is herein omitted:

FIG. 24A shows a block diagram of a signal line drive circuit 401 of this embodiment. 402 shows a shift register, 403 a buffer, 404 a sampling circuit and 405 a current converting circuit.

The shift register 402 is inputted with a clock signal (CLK) and a start pulse signal (SP). When a clock signal (CLK) and start pulse signal (SP) is inputted to the shift register 402, a timing signal is generated.

The generated timing signal is amplified or buffer-amplified in the buffer 403 and then inputted to the sampling circuit 404. Incidentally, a level shifter may be provided in place of the buffer, to amplify the timing signal. Otherwise, both a buffer and a level shifter may be provided.

Figure 24B:
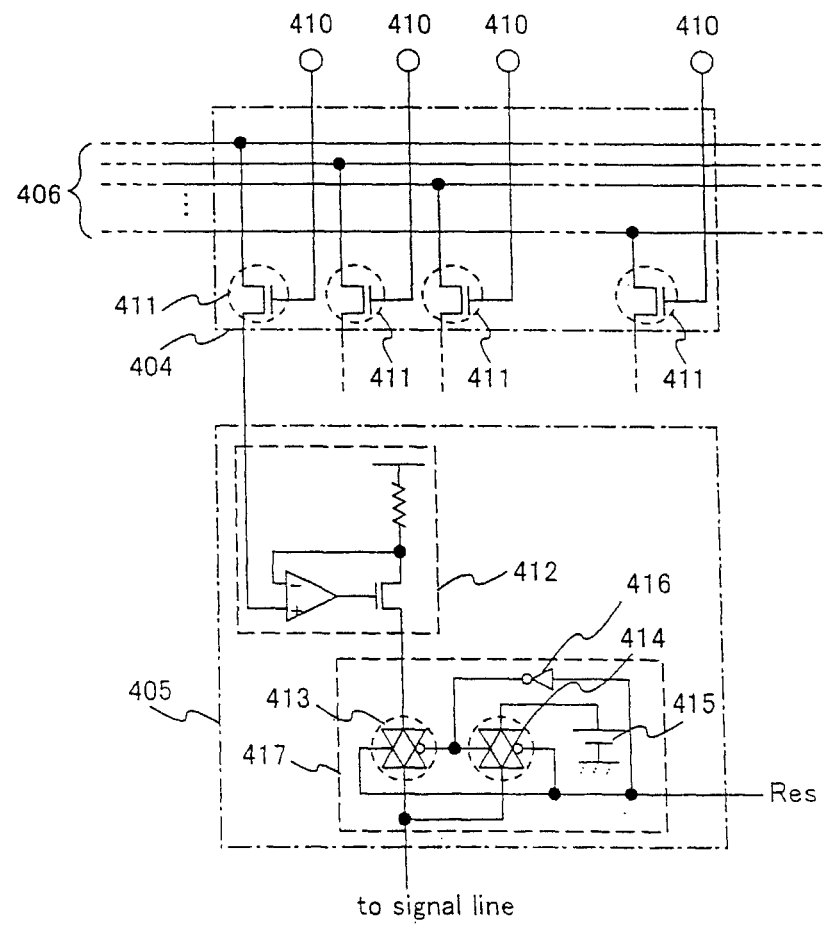

FIG. 24B shows a concrete configuration of the sampling circuit 404 and current converting circuit 405. The sampling circuit 404 at its terminal 410 is connected to a buffer 403.

The sampling circuit 404 is provided with a plurality of switches 411. An analog video signal is inputted to the sampling circuit 404 through a video signal line 406. The switches 411 sample the analog video signal synchronously with the timing signal and inputs it to the rear-staged current converting circuit 405. Incidentally, although FIG. 24B shows only the current converting circuit connected to one of the switches 411 possessed by the sampling circuit 404, it is assumed that current converting circuits 405 as shown in FIG. 24B are respectively connected to the rear stages of the switches 411.

Incidentally, although the example uses only one transistor on the switch 411, the switch 411 is satisfactorily sampling an analog video signal synchronously with the timing signal and not limited to the configuration of this embodiment.

The sampled analog video signal is inputted to a current output circuit 412 possessed by the current converting circuit 405. A current output circuit 412 outputs a current (signal current) in a value commensurate with a voltage of the input video signal. Incidentally, although, in FIG. 24, the current output circuit is formed with using an amplifier and transistor, the present invention is not limited to the configuration but may be a circuit to output a current in a value commensurate with an input signal voltage.

The signal current is inputted to a reset circuit 417 also possessed by the current converting circuit 405. The reset circuit 407 has two analog switches 413, 414, an inverter 416 and a power source 415.

An analog switch 414 is inputted with a reset signal (Res) while an analog switch 413 is inputted with a reset signal (Res) inverted by an inverter 416. The analog switch 413 and the analog switch 414 operate respectively synchronously with the inverted reset signal and the reset signal, so that, when one is on, the other is off.

When the analog switch 413 is on, the signal current is inputted to the corresponding signal line. Conversely, when the analog switch 414 is on, the potential of a power source 415 is provided to the signal line, thereby resetting the signal line. Incidentally, the potential on the power source 415 desirably has nearly the same height as the potential on a power line provided on the pixel. The current flowing through the signal line while the signal line is being reset is preferably as close as possible to 0.

The signal line is desirably reset in a fly-back period. However, reset is possible as required in a period other than a fly-back period if in a period other than the period of displaying an image.

Incidentally, the signal line drive circuit and first scanning line drive circuit for driving the light-emitting device of the present invention is not limited to the configuration shown in this example. The configuration of this example can be carried out in free combination with Embodiments 1-10.

Embodiment 12

In this embodiment, an external light-emitting quantum efficiency can be remarkably improved by using an organic light-emitting material by which phosphorescence from a triplet exciton can be employed for emitting a light. As a result, the power consumption of the OLED can be reduced, the lifetime of the OLED can be elongated and the weight of the OLED can be lightened.

The following is a report where the external light-emitting quantum efficiency is improved by using the triplet exciton (T. Tsutsui, C. Adachi, S. Saito, Photochemical processes in Organized Molecular Systems, ed. K. Honda, (Elsevier Sci. Pub., Tokyo, 1991) p. 437).

The molecular formula of an organic light-emitting material (coumarin pigment) reported by the above article is represented as follows.

Chemical formula 1

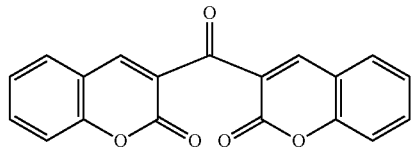

(M. A. Baldo, D. F. O'Brien, Y. You, A. Shoustikov, S. Sibley, M. E. Thompson, S. R. Forrest, Nature 395 (1998) p. 151)

The molecular formula of an organic light-emitting material (Pt complex) reported by the above article is represented as follows.

Chemical formula 2

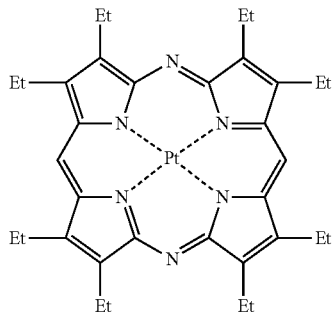

(M. A. Baldo, S. Lamansky, P. E. Burrows, M. E. Thompson, S. R. Forrest, Appl. Phys. Lett., 75 (1999) p. 4.)
(T. Tsutsui, M.-J. Yang, M. Yahiro, K. Nakamura, T. Watanabe, T. Tsuji, Y. Fukuda, T. Wakimoto, S. Mayaguchi, Jpn, Appl. Phys., 38 (12B) (1999) L1502)

The molecular formula of an organic light-emitting material (Ir complex) reported by the above article is represented as follows.

Chemical formula 3

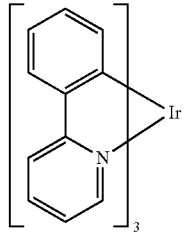

As described above, if phosphorescence from a triplet exciton can be put to practical use, it can realize the external light-emitting quantum efficiency three to four times as high as that in the case of using fluorescence from a singlet exciton in principle.

The structure according to this embodiment can be freely implemented in combination of any structures of Embodiment 1 through 11.

Embodiment 13

In this embodiment, an example of manufacturing the light-emitting device using the present invention is described with reference to FIGS. 25A to 25C.

Figure 25A:
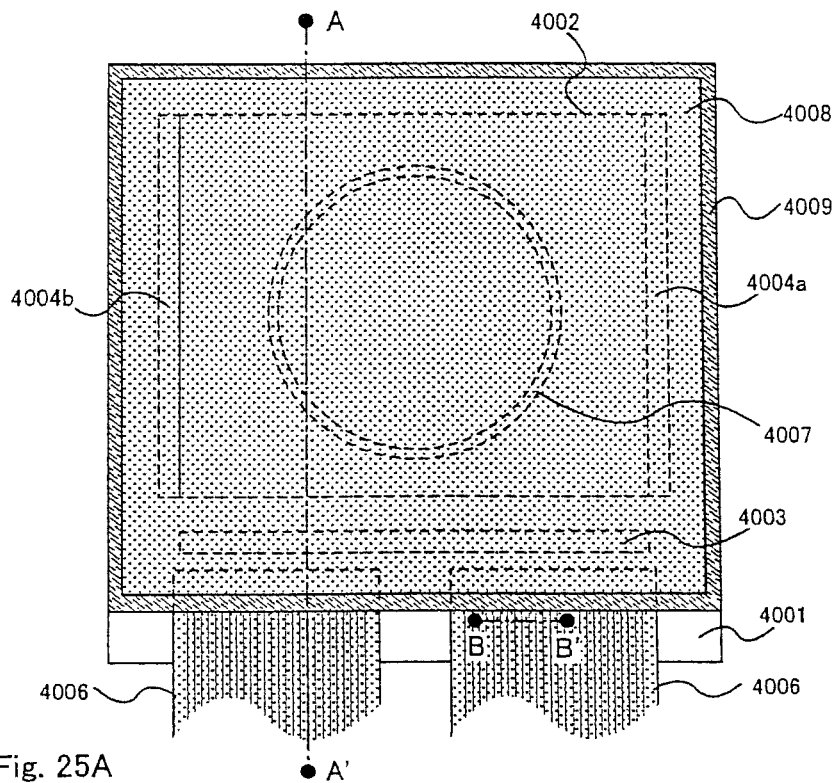
FIG. 25A to 25C are an external view and sectional views of the light-emitting device of the present invention.
Figure 25B:
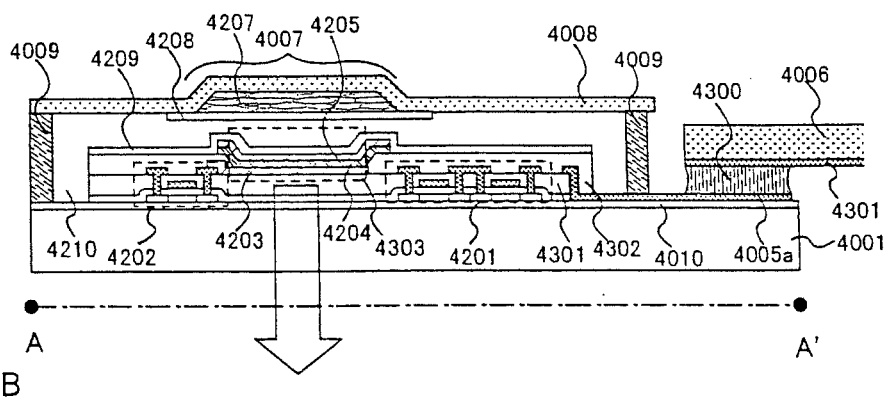
Figure 25C:
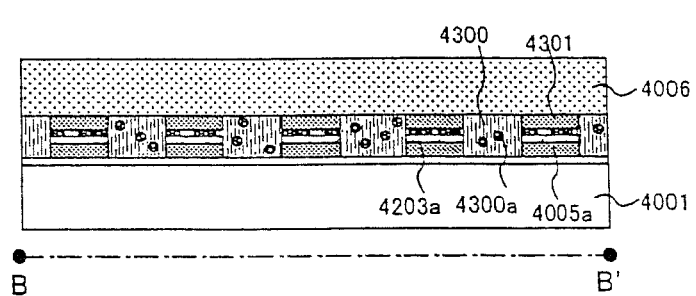

FIG. 25 is a top view of the light-emitting device which is formed according as the element substrate with the transistor is sealed by sealing materials, FIG. 25B is a cross sectional view taken along with a line A-A' of FIG. 25A, and FIG. 25C is a cross sectional view taken along with a line B-B' of FIG. 25A.

A seal member 4009 is provided so as to surround a pixel portion 4002, a signal line driver circuit 4003, and the first, second scanning line driver circuits 4004a, 4004b, which are provided on a substrate 4001. Further, a sealing material 4008 is provided on the pixel portion 4002, the signal line driver circuit 4003, and the first, the second scanning line driver circuits 4004a, 4004b. Thus, the pixel portion 4002, the signal line driver circuit 4003, and the first, the second scanning line driver circuits 4004a, 4004b are sealed by the substrate 4001, the seal member 4009 and the sealing material 4008 together with a filler 4210.

Further, the pixel portion 4002, the signal line driver circuit 4003, and the first, the second scanning line driver circuits 4004a, 4004b, which are provided on the substrate 4001, have a plurality of TFTs. In FIG. 25B, a driver circuit TFT (Here, an n-channel TFT and a p-channel TFT are shown in the figure.) 4201 included in the signal line driver circuit 4003 and a transistor Tr2 4202 included in the pixel portion 4002, which are formed on a base film 4010, are typically shown.

In this embodiment, the p-channel TFT or the n-channel 1 manufactured by a known method is used as the driving TFT 4201, and the p-channel TFT manufactured by a known method is used as the transistor Tr2 4202. Further, the pixel portion 4002 is provided with a storage capacitor (not illustrated).

An interlayer insulating film (leveling film) 4301 is formed on the driving TFT 4201 and the transistor Tr2 4202, and a pixel electrode (anode) 4203 electrically connected to a drain of the transistor Tr2 4202 is formed thereon. A transparent conductive film having a large work function is used for the pixel electrode 4203. A compound of indium oxide and tin oxide, a compound of indium oxide and zinc oxide, zinc oxide, tin oxide or indium oxide can be used for the transparent conductive film. The above transparent conductive film added with gallium may also be used.

Then, an insulating film 4302 is formed on the pixel electrode 4203, and the insulating film 4302 is formed with an opening portion on the pixel electrode 4203. In this opening portion, an organic light-emitting layer 4204 is formed on the pixel electrode 4203. A known organic light-emitting material or inorganic light-emitting material may be used for the organic light-emitting layer 4204. Further, there exist a low molecular weight (monomer) material and a high molecular weight (polymer) material as the organic light-emitting materials, and both the materials may be used.

A known evaporation technique or application technique may be used as a method of forming the organic light-emitting layer 4204. Further, the structure of the organic light-emitting layer may take a lamination structure or a single layer structure by freely combining a hole injecting layer, a hole transporting layer, a light-emitting layer, an electron transporting layer and an electron injecting layer.

A cathode 4205 made of a conductive film having light-shielding property (typically, conductive film containing aluminum, copper or silver as its main constituent or lamination film of the above conductive film and another conductive film) is formed on the organic light-emitting layer 4204. Further, it is desirable that moisture and oxygen that exist on an interface of the cathode 4205 and the organic light-emitting layer 4204 are removed as much as possible. Therefore, such a device is necessary that the organic light-emitting layer 4204 is formed in a nitrogen or rare gas atmosphere, and then, the cathode 4205 is formed without exposure to oxygen and moisture. In this example, the above-described film deposition is enabled by using a multi-chamber type (cluster tool type) film forming device. In addition, a predetermined voltage is given to the cathode 4205.

As described above, an OLED 4303 constituted of the pixel electrode (anode) 4203, the organic light-emitting layer 4204 and the cathode 4205 is formed. Further, a protective film 4209 is formed on the insulating film 4302 so as to cover the OLED 4303. The protective film 4209 is effective in preventing oxygen, moisture and the like from permeating the OLED 4303.

Reference symbol 4005a denotes a wiring drawn to be Connected to the power supply line, and the wiring 4005a is electrically connected to a source region of the transistor Tr2 4202. The drawn wiring 4005a passes between the seal member 4009 and the substrate 4001, and is electrically connected to an FPC wiring 4206 of an FPC 4006 through an anisotropic conductive film 4300.

A glass material, a metal material (typically, stainless material), a ceramics material or a plastic material (including a plastic film) can be used for the sealing material 4008. As the plastic material, an FRP (fiberglass-reinforced plastics) plate, a PVF (polyvinyl fluoride) film, a Mylar film, a polyester film or an acrylic resin film may be used. Further, a sheet with a structure in which an aluminum foil is sandwiched with the PVF film or the Mylar film can also be used.

However, in the case where the light from the OLED is emitted toward the cover member side, the cover member needs to be transparent. In this case, a transparent substance such as a glass plate, a plastic plate, a polyester film or an acrylic film is used.

Further, in addition to an inert gas such as nitrogen or argon, an ultraviolet curable resin or a thermosetting resin may be used as the filler 4210, so that PVC (polyvinyl chloride), acrylic, polyimide, epoxy resin, silicone resin, PVB (polyvinyl butyral) or EVA (ethylene vinyl acetate) can be used. In this example, nitrogen is used for the filler.

Moreover, a concave portion 4007 is provided on the surface of the sealing material 4008 on the substrate 4001 side, and a hygroscopic substance or a substance that can absorb oxygen 4207 is arranged therein in order that the filler 4210 is made to be exposed to the hygroscopic substance (preferably, barium oxide) or the substance that can absorb oxygen. Then, the hygroscopic substance or the substance that can absorb oxygen 4207 is held in the concave portion 4007 by a concave portion cover member 4208 such that the hygroscopic substance or the substance that can absorb oxygen 4207 is not scattered. Note that the concave portion cover member 4208 has a fine mesh form, and has a structure in which air and moisture are penetrated while the hygroscopic substance or the substance that can absorb oxygen 4207 is not penetrated. The deterioration of the OLED 4303 can be suppressed by providing the hygroscopic substance or the substance that can absorb oxygen 4207.

As shown in FIG. 25C, the pixel electrode 4203 is formed, and at the same time, a conductive film 4203a is formed so as to contact the drawn wiring 4005a.

Further, the anisotropic conductive film 4300 has conductive filler 4300a. The conductive film 4203a on the substrate 4001 and the FPC wiring 4301 on the FPC 4006 are electrically connected to each other by the conductive filler 4300a by heat-pressing the substrate 4001 and the FPC 4006.

Note that this embodiment can be implemented by being freely combined with Embodiment 1 through 12.

Embodiment 14

The light-emitting device using the OLED is of the self-emission type, and thus exhibits more excellent recognizability of the displayed image in a light place as compared to the liquid crystal display device. Furthermore, the light-emitting device has a wider viewing angle. Accordingly, the light-emitting device can be applied to a display portion in various electronic devices.

Such electronic devices using a light-emitting device of the present invention include a video camera, a digital camera, a goggles-type display (head mount display), a navigation system, a sound reproduction device (a car audio equipment and an audio set), a lap-top computer, a game machine, a portable information terminal (a mobile computer, a mobile telephone, a portable game machine, an electronic book, or the like), an image reproduction apparatus including a recording medium (more specifically, an apparatus which can reproduce a recording medium such as a digital versatile disc (DVD) and so forth, and includes a display for displaying the reproduced image), or the like. In particular, in the case of the portable information terminal, use of the light-emitting device is preferable, since the portable information terminal that is likely to be viewed from a tilted direction is often required to have a wide viewing angle. FIG. 26 respectively shows various specific examples of such electronic devices.

Figure 26A:
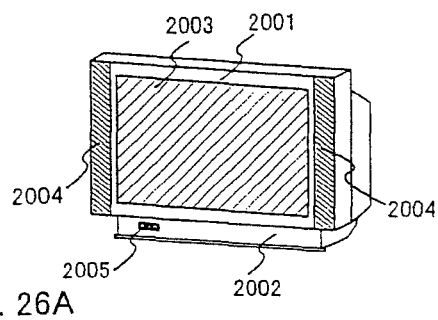
FIG. 26A to 26H are views of electronic apparatus using a light-emitting device of the present invention.

FIG. 26A illustrates an organic light emitting display device which includes a casing 2001, a support table 2002, a display portion 2003, a speaker portion 2004, a video input terminal 2005 or the like. The present invention is applicable to the display portion 2003. The light-emitting device is of the self-emission-type and therefore requires no backlight Thus, the display portion thereof can have a thickness thinner than that of the liquid crystal display device. The organic light emitting display device is including the entire display device for displaying information, such as a personal computer, a receiver of TV broadcasting and an advertising display.

Figure 26B:
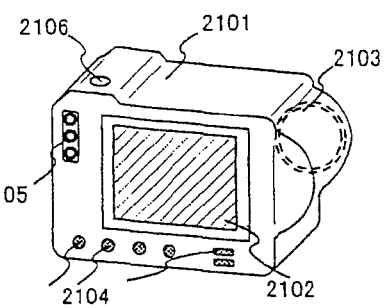

FIG. 26B illustrated a digital still camera which includes a main body 2101, a display portion 2102, an image receiving portion 2103, an operation key 2104, an external connection port 2105, a shutter 2106, or the like. The light-emitting device in accordance with the present invention can be used as the display portion 2102.

Figure 26C:
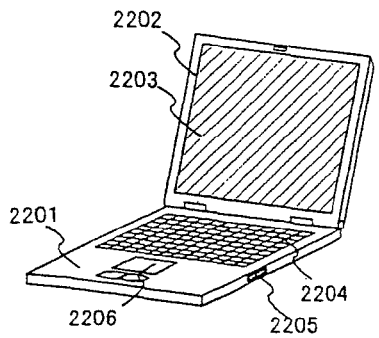

FIG. 26C illustrates a lap-top computer which includes a main body 2201, a casing 2202, a display portion 2203, a keyboard 2204, an external connection port 2205, a pointing mouse 2206, or the like. The light-emitting device in accordance with the present invention can be used as the display portion 2203.

Figure 26D:
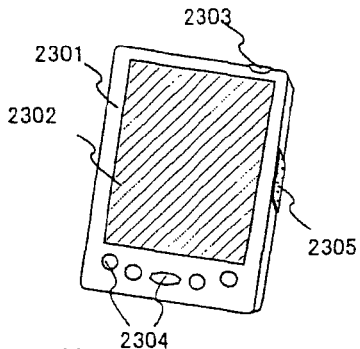

FIG. 26D illustrated a mobile computer which includes a main body 2301, a display portion 2302, a switch 2303, an operation key 2304, an infrared port 2305, or the like. The light-emitting device in accordance with the present invention can be used as the display portion 2302.

Figure 26E:
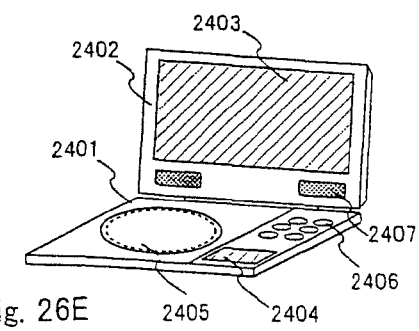

FIG. 26E illustrates a portable image reproduction apparatus including a recording medium (more specifically, a DVD reproduction apparatus), which includes a main body 2401, a casing 2402, a display portion A 2403, another display portion B 2404, a recording medium (DVD or the like) reading portion 2405, an operation key 2406, a speaker portion 2407 or the like. The display portion A 2403 is used mainly for displaying image information, while the display portion B 2404 is used mainly for displaying character information. The light-emitting device in accordance with the present invention can be used as these display portions A 2403 and B 2404. The image reproduction apparatus including a recording medium further includes a game machine or the like.

Figure 26F:
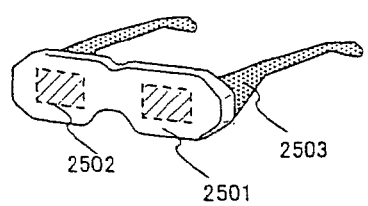

FIG. 26F illustrates a goggle type display (head mounted display) which includes a main body 2501, a display portion 2502, arm portion 2503 or the like. The light-emitting device in accordance with the present invention can be used as the display portion 2502.

Figure 26G:
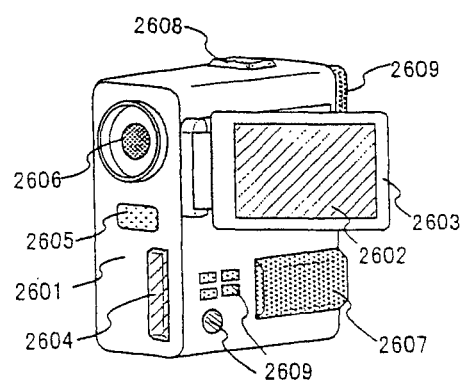

FIG. 26G illustrates a video camera which includes a main body 2601, a display portion 2602, a casing 2603, an external connecting port 2604, a remote control receiving portion 2605, an image receiving portion 2606, a battery 2607, a sound input portion 2608, an operation key 2609, or the like. The light-emitting device in accordance with the present invention can be used as the display portion 2602.

Figure 26H:
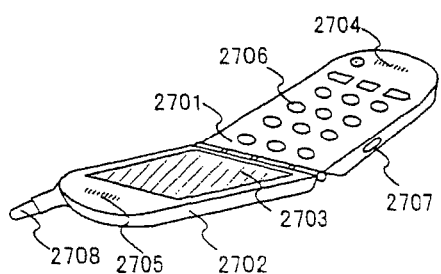
Figure 27:
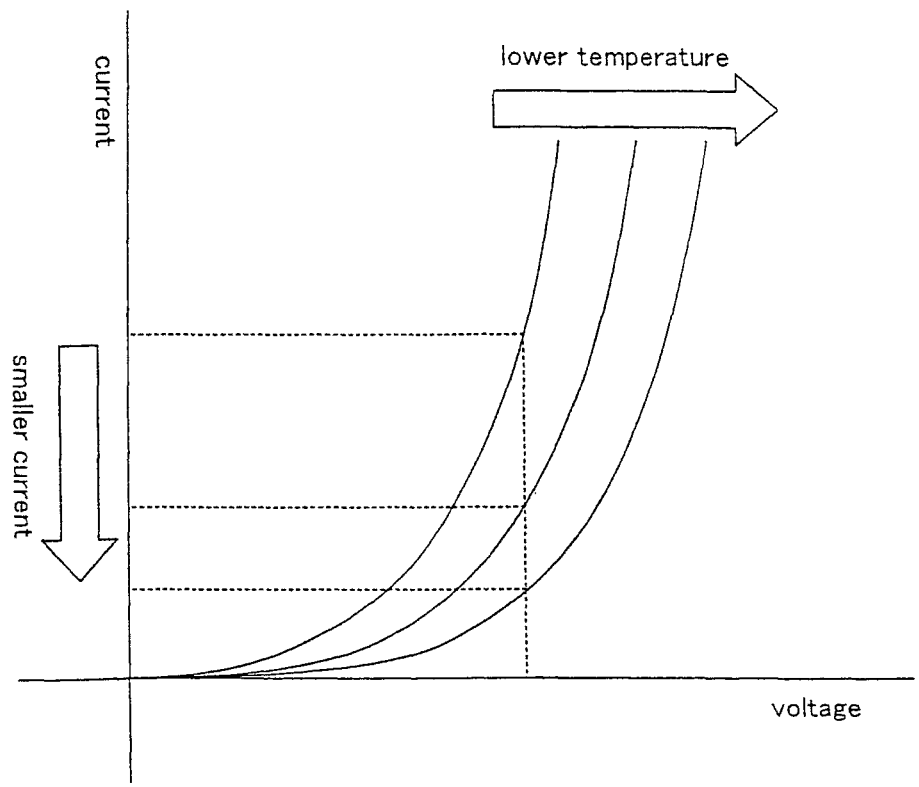
FIG. 27 is a figure showing a voltage-current characteristic of the OLED.

FIG. 26H illustrates a mobile telephone which includes a main body 2701, a casing 2702, a display portion 2703, a sound input portion 2704, a sound output portion 2705, an operation key 2706, an external connecting port 2707, an antenna 2708, or the like. The light-emitting device in accordance with the present invention can be used as the display portion 2703. Note that the display portion 2703 can reduce power consumption of the mobile telephone by displaying white-colored characters on a black-colored background.

When the brighter luminance of light emitted from the organic light-emitting material becomes available in the future, the light-emitting device in accordance with the present invention will be applicable to a front-type or rear-type projector in which light including output image information is enlarged by means of lenses or the like to be projected.

The aforementioned electronic devices are more likely to be used for display information distributed through a telecommunication path such as Internet, a CATV (cable television system), and in particular likely to display moving picture information. The light-emitting device is suitable for displaying moving pictures since the organic light-emitting material can exhibit high response speed.

A portion of the light-emitting device that is emitting light consumes power, so it is desirable to display information in such a manner that the light-emitting portion therein becomes as small as possible. Accordingly, when the light-emitting device is applied to a display portion which mainly displays character information, e.g., a display portion of a portable information terminal, and more particular, a portable telephone or a sound reproduction device, it is desirable to drive the light-emitting device so that the character information is formed by a light-emitting portion while a non-emission portion corresponds to the background.

As set forth above, the present invention can be applied variously to a wide range of electronic devices in all fields. The electronic device in this embodiment can be obtained by utilizing a light-emitting device having the configuration in which the structures in Embodiment 1 through 13 are freely combined.

With the above structure, the light-emitting device of the present invention can obtain a constant brightness without being affected by temperature change. Meanwhile, in the case of providing an OLED having organic light-emitting materials different between colors in color display, it is possible to prevent the impossibility to obtain a desired color due to random variation in OLED brightness of the colors with temperature.

What is claimed is:

1. A semiconductor device comprising:
a first gate driver electrically connecting to a first scanning line;
a second gate driver electrically connecting to a second scanning line;
a power line;
a signal line;
a first transistor;
a second transistor;
a third transistor;
a fourth transistor; and
a capacitor,
wherein a gate of the third transistor is electrically connected to the first scanning line,
wherein a gate of the fourth transistor is electrically connected to the first scanning line,
wherein a gate of the second transistor is electrically connected to the second scanning line,
wherein one of a source and a drain of the third transistor is electrically connected to a gate of the first transistor,
wherein one of a source and a drain of the first transistor is electrically connected to the power line and the other of the source and the drain of the first transistor is electrically connected to one of a source and a drain of the second transistor, and
wherein an electrode of the capacitor includes a semiconductor film.

2. The semiconductor device according to claim 1, wherein the other of the source and the drain of the third transistor is electrically connected to the signal line.

3. The semiconductor device according to claim 1, wherein the third transistor is electrically connected to the fourth transistor through the signal line.

4. The semiconductor device according to claim 1, wherein the first transistor and the second transistor are of the same polarity.

5. The semiconductor device according to claim 1, wherein the third transistor and the fourth transistor are of the same polarity.

6. The semiconductor device according to claim 1, wherein the semiconductor film includes an impurity.

7. The semiconductor device according to claim 1 further comprising an insulating film, wherein the insulating film is interposed between the semiconductor film and the power line.

8. The semiconductor device according to claim 1, further comprising a pixel including the first transistor, the second transistor, the third transistor, the fourth transistor, and the capacitor.

9. A semiconductor device comprising:
a first gate driver electrically connecting to a first scanning line;
a second gate driver electrically connecting to a second scanning line;
a power line;
a signal line;
a first transistor;
a second transistor;
a third transistor;
a fourth transistor; and
a capacitor,
wherein a gate of the third transistor is electrically connected to the first scanning line,
wherein a gate of the fourth transistor is electrically connected to the first scanning line,
wherein a gate of the second transistor is electrically connected to the second scanning line,
wherein one of a source and a drain of the fourth transistor is electrically connected to the signal line and the other of the source and the drain of the fourth transistor is electrically connected to one of a source and a drain of the second transistor,
wherein one of a source and a drain of the first transistor is electrically connected to the power line and the other of the source and the drain of the first transistor is electrically connected to the one of the source and the drain of the second transistor, and
wherein an electrode of the capacitor includes a semiconductor film.

10. The semiconductor device according to claim 9, wherein the fourth transistor is electrically connected to the third transistor through the signal line.

11. The semiconductor device according to claim 9, wherein the first transistor and the second transistor are of the same polarity.

12. The semiconductor device according to claim 9, wherein the third transistor and the fourth transistor are of the same polarity.

13. The semiconductor device according to claim 9, wherein the semiconductor film includes an impurity.

14. The semiconductor device according to claim 9 further comprising an insulating film, wherein the insulating film is interposed between the semiconductor film and the power line.

15. The semiconductor device according to claim 9, further comprising a pixel including the first transistor, the second transistor, the third transistor, the fourth transistor, and the capacitor.

16. A semiconductor device comprising:
a first gate driver electrically connecting to a first scanning line;
a second gate driver electrically connecting to a second scanning line;
a signal line;
a power line; and
a first transistor;
a second transistor;
a third transistor;
a fourth transistor; and
a capacitor,
wherein a gate of the third transistor is electrically connected to the first scanning line,
wherein a gate of the fourth transistor is electrically connected to the first scanning line,
wherein a gate of the second transistor is electrically connected to the second scanning line,
wherein one of a source and a drain of the third transistor is electrically connected to a gate of the first transistor,
wherein one of a source and a drain of the fourth transistor is electrically connected to the signal line and the other of the source and the drain of the fourth transistor is electrically connected to one of a source and a drain of the second transistor,
wherein one of a source and a drain of the first transistor is electrically connected to the power line and the other of the source and the drain of the first transistor is electrically connected to the one of the source and the drain of the second transistor, and
wherein an electrode of the capacitor includes a semiconductor film.

17. The semiconductor device according to claim 16, wherein the other of the source and the drain of the third transistor is electrically connected to the signal line.

18. The semiconductor device according to claim 16, wherein the third transistor is electrically connected to the fourth transistor through the signal line.

19. The semiconductor device according to claim 16, wherein the first transistor and the second transistor are of the same polarity.

20. The semiconductor device according to claim 16, wherein the third transistor and the fourth transistor are of the same polarity.

21. The semiconductor device according to claim 16, wherein the semiconductor film includes an impurity.

22. The semiconductor device according to claim 16 further comprising an insulating film, wherein the insulating film is interposed between the semiconductor film and the power line.

23. The semiconductor device according to claim 16, further comprising a pixel including the first transistor, the second transistor, the third transistor, the fourth transistor, and the capacitor.

* * * * *

UNITED STATES PATENT AND TRADEMARK OFFICE
CERTIFICATE OF CORRECTION

PATENT NO.       : 8,593,066 B2
APPLICATION NO.  : 13/186536
DATED            : November 26, 2013
INVENTOR(S)      : Jun Koyama It is certified that error appears in the above-identified patent and that said Letters Patent is hereby corrected as shown below:

In the Specifications

Column 3, line 32, after "from" delete ",";

Column 9, line 15, after "scanning" delete ",";

Column 9, line 36, replace "hi" with --in--;

Column 9, line 64, replace "OILED" with --OLED--;

Column 9, line 66, replace "Tat" with --Ta2--;

Column 12, line 63, replace "Try" with --Tr5--;

Column 16, line 67, after "pixels" replace ":" with --.--;

Column 17, line 43, replace "wards" with --words--;

Column 19, line 41, before "phase" replace "a" with --α--;

Column 19, line 47, before "phase" replace "a" with --α--;

Column 20, line 47, after "element" delete ",";

Column 22, line 22, after "four" delete ",";

Column 23, line 34, after "are" delete ",";

Column 26, line 9, after "transistor" delete ".";

Column 26, line 64, replace "510" with --610--;

Column 28, lines 48-49, after "omitted" replace ":" with --.--;

Column 31, line 31, replace "1" with --TFT--;

Column 32, line 20, replace "Connected" with --connected--.

Signed and Sealed this
Twenty-second Day of April, 2014

Michelle K. Lee
*Deputy Director of the United States Patent and Trademark Office*